(12) United States Patent
Huang et al.

(10) Patent No.: US 10,128,086 B1
(45) Date of Patent: Nov. 13, 2018

(54) SILICON PRETREATMENT FOR NITRIDE REMOVAL

(71) Applicant: Applied Materials, Inc., Santa Clara, CA (US)

(72) Inventors: Jiayin Huang, San Jose, CA (US); Zhijun Chen, San Jose, CA (US); Anchuan Wang, San Jose, CA (US); Nitin Ingle, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/792,290

(22) Filed: Oct. 24, 2017

(51) Int. Cl.
*H01L 21/3065* (2006.01)
*H01L 21/3213* (2006.01)
(Continued)

(52) U.S. Cl.
CPC ...... *H01J 37/32422* (2013.01); *C23C 16/345* (2013.01); *C23C 16/401* (2013.01);
(Continued)

(58) Field of Classification Search
CPC ........... H01L 21/02057; H01L 21/0206; H01L 21/02063; H01L 21/02164; H01L 21/0217;
(Continued)

(56) References Cited

U.S. PATENT DOCUMENTS 2,369,620 A 2/1945 Sullivan et al.
3,401,302 A 9/1968 Thorpe
(Continued)

FOREIGN PATENT DOCUMENTS

CN 1124364 A 6/1996
CN 1847450 A 10/2006
(Continued)

OTHER PUBLICATIONS

H. Xiao, Introduction to Semiconductor Manufacturing Technology, published by Prentice Hall, 2001, ISBN 0-13-022404-9, pp. 354-356.
(Continued)

*Primary Examiner* — Maliheh Malek

(74) *Attorney, Agent, or Firm* — Kilpatrick Townsend & Stockton LLP

(57) ABSTRACT

Exemplary methods for treating a silicon-containing substrate may include flowing plasma effluents of a hydrogen-containing precursor into a processing region of the semiconductor processing chamber. A silicon-containing substrate may be positioned within the processing region and include a trench formed through stacked layers including alternating layers of silicon nitride and silicon oxide exposing a portion of the silicon-containing substrate. The methods may include contacting the exposed portion of the silicon-containing substrate with the plasma effluents. The methods may include flowing an oxygen-containing precursor into the processing region of the semiconductor processing chamber. The methods may include contacting the exposed portion of the silicon-containing substrate with the oxygen-containing precursor. The methods may also include converting the exposed portion of the silicon-containing substrate to silicon oxide.

20 Claims, 5 Drawing Sheets

(51) Int. Cl.
*H01L 21/768* (2006.01)
*C23C 16/455* (2006.01)
*H01J 37/32* (2006.01)
*C23C 16/40* (2006.01)
*C23C 16/34* (2006.01)
*H01L 21/02* (2006.01)

(52) U.S. Cl.
CPC .. *C23C 16/45529* (2013.01); *C23C 16/45553* (2013.01); *H01L 21/0217* (2013.01); *H01L 21/02164* (2013.01); *H01L 21/32137* (2013.01); *H01L 21/76879* (2013.01)

(58) Field of Classification Search
CPC ...... H01L 21/3065; H01L 21/3105–21/31056; H01L 21/47573; H01L 21/32137; H01L 21/311–21/31116; H01L 21/31122; H01L 21/3081; H01L 21/76801–21/76837; H01L 21/76879; H01J 37/32357; H01J 37/3244; H01J 37/32422; C23C 16/401; C23C 16/345; C23C 16/45529; C23C 16/45553
See application file for complete search history.

(56) References Cited

U.S. PATENT DOCUMENTS

| | | |
|---|---|---|
| 3,451,840 A | 6/1969 | Hough |
| 3,537,474 A | 11/1970 | Rohrer |
| 3,756,511 A | 9/1973 | Shinroku |
| 3,937,857 A | 2/1976 | Brummett et al. |
| 3,969,077 A | 7/1976 | Hill |
| 4,006,047 A | 2/1977 | Brummett et al. |
| 4,190,488 A | 2/1980 | Winters |
| 4,209,357 A | 6/1980 | Gorin et al. |
| 4,214,946 A | 7/1980 | Forget et al. |
| 4,232,060 A | 11/1980 | Mallory, Jr. |
| 4,234,628 A | 11/1980 | DuRose |
| 4,265,943 A | 5/1981 | Goldstein et al. |
| 4,340,462 A | 7/1982 | Koch |
| 4,341,592 A | 7/1982 | Shortes et al. |
| 4,361,418 A | 11/1982 | Tscheppe |
| 4,361,441 A | 11/1982 | Tylko |
| 4,364,803 A | 12/1982 | Nidola et al. |
| 4,368,223 A | 1/1983 | Kobayashi et al. |
| 4,374,698 A | 2/1983 | Sanders et al. |
| 4,397,812 A | 8/1983 | Mallory, Jr. |
| 4,468,413 A | 8/1984 | Bachmann |
| 4,565,601 A | 1/1986 | Kakehi et al. |
| 4,579,618 A | 4/1986 | Celestino et al. |
| 4,585,920 A | 4/1986 | Hoog et al. |
| 4,610,775 A | 9/1986 | Phifer |
| 4,625,678 A | 12/1986 | Shloya et al. |
| 4,632,857 A | 12/1986 | Mallory, Jr. |
| 4,656,052 A | 4/1987 | Satou et al. |
| 4,656,076 A | 4/1987 | Vetanen et al. |
| 4,668,335 A | 5/1987 | Mockler |
| 4,690,746 A | 9/1987 | McInerney et al. |
| 4,715,937 A | 12/1987 | Moslehi et al. |
| 4,749,440 A | 6/1988 | Blackwood et al. |
| 4,753,898 A | 6/1988 | Parrillo et al. |
| 4,786,360 A | 11/1988 | Cote et al. |
| 4,792,378 A | 12/1988 | Rose et al. |
| 4,793,897 A | 12/1988 | Dunfield et al. |
| 4,807,016 A | 2/1989 | Douglas |
| 4,810,520 A | 3/1989 | Wu |
| 4,816,638 A | 3/1989 | Ukai et al. |
| 4,820,377 A | 4/1989 | Davis et al. |
| 4,828,649 A | 5/1989 | Davis |
| 4,857,140 A | 8/1989 | Loewenstein |
| 4,867,841 A | 9/1989 | Loewenstein et al. |
| 4,904,621 A | 2/1990 | Lowenstein et al. |
| 4,913,929 A | 4/1990 | Moslehi et al. |
| 4,919,750 A | 4/1990 | Bausmith et al. |
| 4,946,903 A | 8/1990 | Gardella et al. |
| 4,951,601 A | 8/1990 | Maydan et al. |
| 4,960,488 A | 10/1990 | Law et al. |
| 4,980,018 A | 12/1990 | Mu et al. |
| 4,981,551 A | 1/1991 | Palmour |
| 4,985,372 A | 1/1991 | Narita et al. |
| 4,991,542 A | 2/1991 | Kohmura et al. |
| 4,992,136 A | 2/1991 | Tachi et al. |
| 4,993,358 A | 2/1991 | Mahawili |
| 4,994,404 A | 2/1991 | Sheng et al. |
| 5,000,113 A | 3/1991 | Wang et al. |
| 5,006,192 A | 4/1991 | Deguchi |
| 5,010,842 A | 4/1991 | Oda et al. |
| 5,013,691 A | 5/1991 | Lory et al. |
| 5,028,565 A | 7/1991 | Chang |
| 5,030,319 A | 7/1991 | Nishino et al. |
| 5,038,713 A | 8/1991 | Kawakami et al. |
| 5,045,244 A | 9/1991 | Marlett |
| 5,061,838 A | 10/1991 | Lane et al. |
| 5,069,938 A | 12/1991 | Lorimer et al. |
| 5,083,030 A | 1/1992 | Stavov |
| 5,089,441 A | 2/1992 | Moslehi |
| 5,089,442 A | 2/1992 | Olmer |
| 5,147,692 A | 9/1992 | Bengston |
| 5,156,881 A | 10/1992 | Okano et al. |
| 5,180,435 A | 1/1993 | Markunas et al. |
| 5,186,718 A | 2/1993 | Tepman et al. |
| 5,188,706 A | 2/1993 | Hori et al. |
| 5,198,034 A | 3/1993 | deBoer et al. |
| 5,203,911 A | 4/1993 | Sricharoenchalkit et al. |
| 5,215,787 A | 6/1993 | Homma |
| 5,221,427 A | 6/1993 | Koinuma et al. |
| 5,228,501 A | 7/1993 | Tepman et al. |
| 5,231,690 A | 7/1993 | Soma et al. |
| 5,235,139 A | 8/1993 | Bengston et al. |
| 5,238,499 A | 8/1993 | van de Ven et al. |
| 5,240,497 A | 8/1993 | Shacham et al. |
| 5,248,371 A | 9/1993 | Maher et al. |
| 5,248,527 A | 9/1993 | Uchida et al. |
| 5,252,178 A | 10/1993 | Moslehi |
| 5,266,157 A | 11/1993 | Kadomura |
| 5,269,881 A | 12/1993 | Sekiya |
| 5,270,125 A | 12/1993 | America et al. |
| 5,271,972 A | 12/1993 | Kwok et al. |
| 5,275,977 A | 1/1994 | Otsubo et al. |
| 5,277,750 A | 1/1994 | Wolgang |
| 5,279,669 A | 1/1994 | Lee |
| 5,279,865 A | 1/1994 | Chebi et al. |
| 5,288,518 A | 2/1994 | Homma |
| 5,290,382 A | 3/1994 | Zarowin et al. |
| 5,290,383 A | 3/1994 | Koshimizu |
| 5,292,370 A | 3/1994 | Tsai et al. |
| 5,292,682 A | 3/1994 | Stevens et al. |
| 5,300,463 A | 4/1994 | Cathey et al. |
| 5,302,233 A | 4/1994 | Kim et al. |
| 5,304,250 A | 4/1994 | Sameshima et al. |
| 5,306,530 A | 4/1994 | Strongin et al. |
| 5,314,724 A | 5/1994 | Tsukune et al. |
| 5,319,247 A | 6/1994 | Matsuura |
| 5,326,427 A | 7/1994 | Jerbic |
| 5,328,558 A | 7/1994 | Kawamura et al. |
| 5,328,810 A | 7/1994 | Lowrey et al. |
| 5,330,578 A | 7/1994 | Sakama |
| 5,334,552 A | 8/1994 | Homma |
| 5,345,999 A | 9/1994 | Hosokawa |
| 5,352,636 A | 10/1994 | Beinglass |
| 5,356,478 A | 10/1994 | Chen et al. |
| 5,362,526 A | 11/1994 | Wang et al. |
| 5,366,585 A | 11/1994 | Robertson et al. |
| 5,368,897 A | 11/1994 | Kurihara et al. |
| 5,378,316 A | 1/1995 | Franke et al. |
| 5,380,560 A | 1/1995 | Kaja et al. |
| 5,382,311 A | 1/1995 | Ishikawa et al. |
| 5,384,284 A | 1/1995 | Doan et al. |
| 5,385,763 A | 1/1995 | Okano et al. |
| 5,399,237 A | 3/1995 | Keswick et al. |
| 5,399,529 A | 3/1995 | Homma |
| 5,403,434 A | 4/1995 | Moslehi |
| 5,413,670 A | 5/1995 | Langan et al. |

(56) References Cited

U.S. PATENT DOCUMENTS

| | | |
|---|---|---|
| 5,413,967 A | 5/1995 | Matsuda et al. |
| 5,415,890 A | 5/1995 | Kloiber et al. |
| 5,416,048 A | 5/1995 | Blalock et al. |
| 5,420,075 A | 5/1995 | Homma et al. |
| 5,429,995 A | 7/1995 | Nishiyama et al. |
| 5,439,553 A | 8/1995 | Grant et al. |
| 5,451,259 A | 9/1995 | Krogh |
| 5,464,499 A | 11/1995 | Moslehi |
| 5,468,342 A | 11/1995 | Nulty et al. |
| 5,474,589 A | 12/1995 | Ohga et al. |
| 5,478,403 A | 12/1995 | Shinigawa et al. |
| 5,478,462 A | 12/1995 | Walsh |
| 5,483,920 A | 1/1996 | Pryor |
| 5,494,494 A | 2/1996 | Mizuno et al. |
| 5,500,249 A | 3/1996 | Telford et al. |
| 5,505,816 A | 4/1996 | Barnes et al. |
| 5,510,216 A | 4/1996 | Calabrese et al. |
| 5,516,367 A | 5/1996 | Lei et al. |
| 5,518,962 A | 5/1996 | Murao |
| 5,531,835 A | 7/1996 | Fodor et al. |
| 5,534,070 A | 7/1996 | Okamura et al. |
| 5,536,360 A | 7/1996 | Nguyen et al. |
| 5,549,780 A | 8/1996 | Koinuma et al. |
| 5,558,717 A | 9/1996 | Zhao et al. |
| 5,560,779 A | 10/1996 | Knowles et al. |
| 5,563,105 A | 10/1996 | Dobuzinsky et al. |
| 5,567,243 A | 10/1996 | Foster et al. |
| 5,571,576 A | 11/1996 | Qian et al. |
| 5,575,853 A | 11/1996 | Arami et al. |
| 5,578,130 A | 11/1996 | Hayashi et al. |
| 5,578,161 A | 11/1996 | Auda |
| 5,580,421 A | 12/1996 | Hiatt et al. |
| 5,591,269 A | 1/1997 | Arami et al. |
| 5,592,358 A | 1/1997 | Shamouilian |
| 5,599,740 A | 2/1997 | Jang et al. |
| 5,614,055 A | 3/1997 | Fairbairn et al. |
| 5,616,518 A | 4/1997 | Foo et al. |
| 5,624,582 A | 4/1997 | Cain |
| 5,626,922 A | 5/1997 | Miyanaga et al. |
| 5,628,829 A | 5/1997 | Foster et al. |
| 5,635,086 A | 6/1997 | Warren, Jr. |
| 5,645,645 A | 7/1997 | Zhang et al. |
| 5,648,125 A | 7/1997 | Cane |
| 5,648,175 A | 7/1997 | Russell et al. |
| 5,656,093 A | 8/1997 | Burkhart et al. |
| 5,660,957 A | 8/1997 | Chou et al. |
| 5,661,093 A | 8/1997 | Ravi et al. |
| 5,670,066 A | 9/1997 | Barnes et al. |
| 5,674,787 A | 10/1997 | Zhao et al. |
| 5,676,758 A | 10/1997 | Hasgawa et al. |
| 5,679,606 A | 10/1997 | Wang et al. |
| 5,685,946 A | 11/1997 | Fathauer et al. |
| 5,688,331 A | 11/1997 | Aruga et al. |
| 5,695,810 A | 12/1997 | Dubin et al. |
| 5,712,185 A | 1/1998 | Tsai et al. |
| 5,716,500 A | 2/1998 | Bardos et al. |
| 5,716,506 A | 2/1998 | Maclay et al. |
| 5,719,085 A | 2/1998 | Moon et al. |
| 5,733,816 A | 3/1998 | Iyer et al. |
| 5,747,373 A | 5/1998 | Yu |
| 5,753,886 A | 5/1998 | Iwamura et al. |
| 5,755,859 A | 5/1998 | Brusic et al. |
| 5,756,400 A | 5/1998 | Ye et al. |
| 5,756,402 A | 5/1998 | Jimbo et al. |
| 5,772,770 A | 6/1998 | Suda et al. |
| 5,781,693 A | 7/1998 | Ballance et al. |
| 5,786,276 A | 7/1998 | Brooks et al. |
| 5,788,825 A | 8/1998 | Park et al. |
| 5,789,300 A | 8/1998 | Fulford |
| 5,792,376 A | 8/1998 | Kanai et al. |
| 5,800,686 A | 9/1998 | Littau et al. |
| 5,804,259 A | 9/1998 | Robles |
| 5,812,403 A | 9/1998 | Fong et al. |
| 5,814,238 A | 9/1998 | Ashby et al. |
| 5,814,365 A | 9/1998 | Mahawill |
| 5,820,723 A | 10/1998 | Benjamin et al. |
| 5,824,599 A | 10/1998 | Schacham-Diamand et al. |
| 5,830,805 A | 11/1998 | Schacham-Diamand et al. |
| 5,835,334 A | 11/1998 | McMillin et al. |
| 5,843,538 A | 12/1998 | Ehrsam et al. |
| 5,843,847 A | 12/1998 | Pu et al. |
| 5,844,195 A | 12/1998 | Fairbairn et al. |
| 5,846,332 A | 12/1998 | Zhao et al. |
| 5,846,373 A | 12/1998 | Pirkle et al. |
| 5,846,375 A | 12/1998 | Gilchrist et al. |
| 5,846,598 A | 12/1998 | Semkow et al. |
| 5,849,639 A | 12/1998 | Molloy et al. |
| 5,850,105 A | 12/1998 | Dawson et al. |
| 5,855,681 A | 1/1999 | Maydan et al. |
| 5,855,685 A | 1/1999 | Tobe et al. |
| 5,856,240 A | 1/1999 | Sinha et al. |
| 5,858,876 A | 1/1999 | Chew |
| 5,863,376 A | 1/1999 | Wicker |
| 5,865,896 A | 2/1999 | Nowak |
| 5,866,483 A | 2/1999 | Shiau et al. |
| 5,872,052 A | 2/1999 | Iyer |
| 5,872,058 A | 2/1999 | Van Cleemput et al. |
| 5,882,424 A | 3/1999 | Taylor et al. |
| 5,882,786 A | 3/1999 | Nassau et al. |
| 5,883,012 A | 3/1999 | Chiou |
| 5,885,404 A | 3/1999 | Kim et al. |
| 5,885,749 A | 3/1999 | Huggins et al. |
| 5,888,906 A | 3/1999 | Sandhu et al. |
| 5,891,349 A | 4/1999 | Tobe et al. |
| 5,891,513 A | 4/1999 | Dubin et al. |
| 5,897,751 A | 4/1999 | Makowiecki |
| 5,899,752 A | 5/1999 | Hey et al. |
| 5,900,163 A | 5/1999 | Yi et al. |
| 5,904,827 A | 5/1999 | Reynolds |
| 5,907,790 A | 5/1999 | Kellam |
| 5,910,340 A | 6/1999 | Uchida et al. |
| 5,913,147 A | 6/1999 | Dubin et al. |
| 5,913,978 A | 6/1999 | Kato et al. |
| 5,915,190 A | 6/1999 | Pirkle |
| 5,918,116 A | 6/1999 | Chittipeddi |
| 5,919,332 A | 7/1999 | Koshiishi et al. |
| 5,920,792 A | 7/1999 | Lin |
| 5,926,737 A | 7/1999 | Ameen et al. |
| 5,932,077 A | 8/1999 | Reynolds |
| 5,933,757 A | 8/1999 | Yoshikawa et al. |
| 5,935,334 A | 8/1999 | Fong et al. |
| 5,935,340 A | 8/1999 | Xia et al. |
| 5,937,323 A | 8/1999 | Orczyk et al. |
| 5,939,831 A | 8/1999 | Fong et al. |
| 5,942,075 A | 8/1999 | Nagahata et al. |
| 5,944,049 A | 8/1999 | Beyer et al. |
| 5,944,902 A | 8/1999 | Redeker et al. |
| 5,948,702 A | 9/1999 | Rotondaro |
| 5,951,601 A | 9/1999 | Lesinski et al. |
| 5,951,776 A | 9/1999 | Selyutin et al. |
| 5,951,896 A | 9/1999 | Mahawill |
| 5,953,591 A | 9/1999 | Ishihara et al. |
| 5,953,635 A | 9/1999 | Andideh |
| 5,963,840 A | 10/1999 | Xia et al. |
| 5,968,587 A | 10/1999 | Frankel et al. |
| 5,968,610 A | 10/1999 | Liu et al. |
| 5,969,422 A | 10/1999 | Ting et al. |
| 5,976,327 A | 11/1999 | Tanaka |
| 5,990,000 A | 11/1999 | Hong et al. |
| 5,990,013 A | 11/1999 | Berenguer et al. |
| 5,993,916 A | 11/1999 | Zhao et al. |
| 5,994,209 A | 11/1999 | Yieh et al. |
| 5,997,649 A | 12/1999 | Hillman |
| 5,997,962 A | 12/1999 | Ogasawara et al. |
| 6,004,884 A | 12/1999 | Abraham |
| 6,007,635 A | 12/1999 | Mahawill |
| 6,007,785 A | 12/1999 | Liou |
| 6,010,962 A | 1/2000 | Liu et al. |
| 6,013,191 A | 1/2000 | Nasser-Faili et al. |
| 6,013,584 A | 1/2000 | M'Saad |
| 6,015,724 A | 1/2000 | Yamazaki et al. |
| 6,015,747 A | 1/2000 | Lopatin et al. |
| 6,017,414 A | 1/2000 | Koemtzopoulos et al. |
| 6,019,848 A | 2/2000 | Kiyama et al. |

(56) References Cited

U.S. PATENT DOCUMENTS

| | | | |
|---|---|---|---|
| 6,020,271 A | 2/2000 | Yanagida |
| 6,030,666 A | 2/2000 | Lam et al. |
| 6,030,881 A | 2/2000 | Papasouliotis et al. |
| 6,035,101 A | 3/2000 | Sajoto et al. |
| 6,036,878 A | 3/2000 | Collins et al. |
| 6,037,018 A | 3/2000 | Jang et al. |
| 6,037,266 A | 3/2000 | Tao et al. |
| 6,039,834 A | 3/2000 | Tanaka et al. |
| 6,039,851 A | 3/2000 | Iyer |
| 6,053,982 A | 4/2000 | Halpin et al. |
| 6,059,643 A | 5/2000 | Hu et al. |
| 6,063,683 A | 5/2000 | Wu et al. |
| 6,063,712 A | 5/2000 | Gilton et al. |
| 6,065,424 A | 5/2000 | Shacham-Diamand et al. |
| 6,065,425 A | 5/2000 | Takaki et al. |
| 6,072,147 A | 6/2000 | Koshiishi |
| 6,072,227 A | 6/2000 | Yau et al. |
| 6,074,512 A | 6/2000 | Collins et al. |
| 6,074,514 A | 6/2000 | Bjorkman et al. |
| 6,077,384 A | 6/2000 | Collins et al. |
| 6,077,780 A | 6/2000 | Dubin |
| 6,079,356 A | 6/2000 | Umotoy et al. |
| 6,080,529 A | 6/2000 | Ye et al. |
| 6,081,414 A | 6/2000 | Flanigan et al. |
| 6,083,344 A | 7/2000 | Hanawa et al. |
| 6,083,844 A | 7/2000 | Bui-Le et al. |
| 6,086,677 A | 7/2000 | Umotoy et al. |
| 6,087,278 A | 7/2000 | Kim et al. |
| 6,090,212 A | 7/2000 | Mahawill |
| 6,093,457 A | 7/2000 | Okumura |
| 6,093,594 A | 7/2000 | Yeap et al. |
| 6,099,697 A | 8/2000 | Hausmann |
| 6,107,199 A | 8/2000 | Allen et al. |
| 6,110,530 A | 8/2000 | Chen et al. |
| 6,110,832 A | 8/2000 | Morgan et al. |
| 6,110,836 A | 8/2000 | Cohen et al. |
| 6,110,838 A | 8/2000 | Loewenstein |
| 6,113,771 A | 9/2000 | Landau et al. |
| 6,114,216 A | 9/2000 | Yieh et al. |
| 6,117,245 A | 9/2000 | Mandrekar et al. |
| 6,120,640 A | 9/2000 | Shih et al. |
| 6,136,163 A | 10/2000 | Cheung et al. |
| 6,136,165 A | 10/2000 | Moslehi et al. |
| 6,136,685 A | 10/2000 | Narwankar et al. |
| 6,136,693 A | 10/2000 | Chan et al. |
| 6,140,234 A | 10/2000 | Uzoh et al. |
| 6,144,099 A | 11/2000 | Lopatin et al. |
| 6,147,009 A | 11/2000 | Grill et al. |
| 6,148,761 A | 11/2000 | Majewski et al. |
| 6,149,828 A | 11/2000 | Vaartstra |
| 6,150,628 A | 11/2000 | Smith et al. |
| 6,153,935 A | 11/2000 | Edelstein et al. |
| 6,161,500 A | 12/2000 | Kopacz et al. |
| 6,161,576 A | 12/2000 | Maher et al. |
| 6,162,302 A | 12/2000 | Raghavan et al. |
| 6,162,370 A | 12/2000 | Hackett et al. |
| 6,165,912 A | 12/2000 | McConnell et al. |
| 6,167,834 B1 | 1/2001 | Wang et al. |
| 6,169,021 B1 | 1/2001 | Akram et al. |
| 6,170,428 B1 | 1/2001 | Redeker et al. |
| 6,171,661 B1 | 1/2001 | Zheng et al. |
| 6,174,450 B1 | 1/2001 | Patrick et al. |
| 6,174,810 B1 | 1/2001 | Patrick et al. |
| 6,174,812 B1 | 1/2001 | Hsuing et al. |
| 6,176,198 B1 | 1/2001 | Kao et al. |
| 6,176,667 B1 | 1/2001 | Fairbairn |
| 6,177,245 B1 | 1/2001 | Ward et al. |
| 6,179,924 B1 | 1/2001 | Zhao et al. |
| 6,180,523 B1 | 1/2001 | Lee et al. |
| 6,182,602 B1 | 2/2001 | Redeker et al. |
| 6,182,603 B1 | 2/2001 | Shang et al. |
| 6,184,121 B1 | 2/2001 | Buchwalter et al. |
| 6,186,091 B1 | 2/2001 | Chu et al. |
| 6,189,483 B1 | 2/2001 | Ishikawa et al. |
| 6,190,233 B1 | 2/2001 | Hong et al. |
| 6,194,038 B1 | 2/2001 | Rossman |
| 6,197,181 B1 | 3/2001 | Chen |
| 6,197,364 B1 | 3/2001 | Paunovic et al. |
| 6,197,680 B1 | 3/2001 | Lin et al. |
| 6,197,688 B1 | 3/2001 | Simpson |
| 6,197,705 B1 | 3/2001 | Vassiliev |
| 6,198,616 B1 | 3/2001 | Dahimene et al. |
| 6,203,863 B1 | 3/2001 | Liu et al. |
| 6,204,200 B1 | 3/2001 | Shieh et al. |
| 6,210,486 B1 | 4/2001 | Mizukami et al. |
| 6,217,658 B1 | 4/2001 | Orczyk et al. |
| 6,220,201 B1 | 4/2001 | Nowak |
| 6,225,745 B1 | 5/2001 | Srivastava |
| 6,228,233 B1 | 5/2001 | Lakshmikanthan et al. |
| 6,228,751 B1 | 5/2001 | Yamazaki et al. |
| 6,228,758 B1 | 5/2001 | Pellerin et al. |
| 6,235,643 B1 | 5/2001 | Mui et al. |
| 6,237,527 B1 | 5/2001 | Kellerman et al. |
| 6,238,513 B1 | 5/2001 | Arnold et al. |
| 6,238,582 B1 | 5/2001 | Williams et al. |
| 6,197,151 B1 | 6/2001 | Kaji et al. |
| 6,241,845 B1 | 6/2001 | Gadgil et al. |
| 6,242,349 B1 | 6/2001 | Nogami et al. |
| 6,244,211 B1 | 6/2001 | Nishikawa et al. |
| 6,245,396 B1 | 6/2001 | Nogami |
| 6,245,670 B1 | 6/2001 | Cheung et al. |
| 6,251,236 B1 | 6/2001 | Stevens |
| 6,251,802 B1 | 6/2001 | Moore et al. |
| 6,258,170 B1 | 7/2001 | Somekh et al. |
| 6,258,220 B1 | 7/2001 | Dordi et al. |
| 6,258,223 B1 | 7/2001 | Cheung et al. |
| 6,258,270 B1 | 7/2001 | Hilgendorff et al. |
| 6,261,637 B1 | 7/2001 | Oberle |
| 6,277,733 B1 | 8/2001 | Smith |
| 6,277,752 B1 | 8/2001 | Chen |
| 6,277,763 B1 | 8/2001 | Kugimiya et al. |
| 6,281,072 B1 | 8/2001 | Li et al. |
| 6,281,135 B1 | 8/2001 | Han et al. |
| 6,284,146 B1 | 9/2001 | Kim et al. |
| 6,291,282 B1 | 9/2001 | Wilk et al. |
| 6,291,348 B1 | 9/2001 | Lopatin et al. |
| 6,303,044 B1 | 10/2001 | Koemtzopoulos |
| 6,303,418 B1 | 10/2001 | Cha et al. |
| 6,306,772 B1 | 10/2001 | Lin |
| 6,308,776 B1 | 10/2001 | Sloan |
| 6,310,755 B1 | 10/2001 | Busato et al. |
| 6,312,554 B1 | 11/2001 | Ye |
| 6,312,995 B1 | 11/2001 | Yu |
| 6,319,387 B1 | 11/2001 | Krishnamoorthy et al. |
| 6,321,587 B1 | 11/2001 | Laush |
| 6,322,716 B1 | 11/2001 | Qiao et al. |
| 6,323,128 B1 | 11/2001 | Sambucetti et al. |
| 6,335,288 B1 | 1/2002 | Kwan et al. |
| 6,340,435 B1 | 1/2002 | Bjorkman et al. |
| 6,342,733 B1 | 1/2002 | Hu et al. |
| RE37,546 E | 2/2002 | Mahawill |
| 6,344,410 B1 | 2/2002 | Lopatin et al. |
| 6,348,407 B1 | 2/2002 | Gupta et al. |
| 6,350,320 B1 | 2/2002 | Sherstinsky et al. |
| 6,350,697 B1 | 2/2002 | Richardson |
| 6,351,013 B1 | 2/2002 | Luning et al. |
| 6,352,081 B1 | 3/2002 | Lu et al. |
| 6,355,573 B1 | 3/2002 | Okumura |
| 6,364,949 B1 | 4/2002 | Or et al. |
| 6,364,954 B2 | 4/2002 | Umotoy et al. |
| 6,364,957 B1 | 4/2002 | Schneider et al. |
| 6,375,748 B1 | 4/2002 | Yudovsky et al. |
| 6,376,386 B1 | 4/2002 | Oshima |
| 6,379,575 B1 | 4/2002 | Yin et al. |
| 6,383,896 B1 | 5/2002 | Kirimura et al. |
| 6,383,951 B1 | 5/2002 | Li |
| 6,387,207 B1 | 5/2002 | Janakiraman et al. |
| 6,391,753 B1 | 5/2002 | Yu |
| 6,395,150 B1 | 5/2002 | Van Cleemput et al. |
| 6,403,491 B1 | 6/2002 | Liu et al. |
| 6,415,736 B1 | 7/2002 | Hao et al. |
| 6,416,647 B1 | 7/2002 | Dordi et al. |
| 6,418,874 B1 | 7/2002 | Cox et al. |
| 6,423,284 B1 | 7/2002 | Arno |

(56) References Cited

U.S. PATENT DOCUMENTS

| | | |
|---|---|---|
| 6,427,623 B2 | 8/2002 | Ko |
| 6,429,465 B1 | 8/2002 | Yagi et al. |
| 6,432,819 B1 | 8/2002 | Pavate et al. |
| 6,432,831 B2 | 8/2002 | Dhindsa et al. |
| 6,436,193 B1 | 8/2002 | Kasai et al. |
| 6,436,816 B1 | 8/2002 | Lee et al. |
| 6,440,863 B1 | 8/2002 | Tsai et al. |
| 6,441,492 B1 | 8/2002 | Cunningham |
| 6,446,572 B1 | 9/2002 | Brcka |
| 6,448,537 B1 | 9/2002 | Nering |
| 6,458,718 B1 | 10/2002 | Todd |
| 6,461,974 B1 | 10/2002 | Ni et al. |
| 6,462,371 B1 | 10/2002 | Weimer et al. |
| 6,462,372 B1 | 10/2002 | Xia et al. |
| 6,465,051 B1 | 10/2002 | Sahin et al. |
| 6,465,350 B1 | 10/2002 | Taylor et al. |
| 6,465,366 B1 | 10/2002 | Nemani et al. |
| 6,477,980 B1 | 11/2002 | White et al. |
| 6,479,373 B2 | 11/2002 | Dreybrodt et al. |
| 6,488,984 B1 | 12/2002 | Wada et al. |
| 6,494,959 B1 | 12/2002 | Samoilov et al. |
| 6,499,425 B1 | 12/2002 | Sandhu et al. |
| 6,500,728 B1 | 12/2002 | Wang |
| 6,503,843 B1 | 1/2003 | Xia et al. |
| 6,506,291 B2 | 1/2003 | Tsai et al. |
| 6,509,283 B1 | 1/2003 | Thomas |
| 6,509,623 B1 | 1/2003 | Zhao |
| 6,516,815 B1 | 2/2003 | Stevens et al. |
| 6,518,548 B2 | 2/2003 | Sugaya et al. |
| 6,527,968 B1 | 3/2003 | Wang et al. |
| 6,528,409 B1 | 3/2003 | Lopatin et al. |
| 6,528,751 B1 | 3/2003 | Hoffman et al. |
| 6,537,707 B1 | 3/2003 | Lee |
| 6,537,733 B2 | 3/2003 | Campana et al. |
| 6,541,397 B1 | 4/2003 | Bencher |
| 6,541,671 B1 | 4/2003 | Martinez et al. |
| 6,544,340 B2 | 4/2003 | Yudovsky |
| 6,547,977 B1 | 4/2003 | Yan et al. |
| 6,551,924 B1 | 4/2003 | Dalton et al. |
| 6,558,564 B1 | 5/2003 | Loewenhardt |
| 6,565,661 B1 | 5/2003 | Nguyen |
| 6,565,729 B2 | 5/2003 | Chen et al. |
| 6,569,773 B1 | 5/2003 | Gellrich et al. |
| 6,572,937 B2 | 6/2003 | Hakovirta et al. |
| 6,573,030 B1 | 6/2003 | Fairbairn et al. |
| 6,573,606 B2 | 6/2003 | Sambucetti et al. |
| 6,585,851 B1 | 7/2003 | Ohmi et al. |
| 6,586,163 B1 | 7/2003 | Okabe et al. |
| 6,596,599 B1 | 7/2003 | Guo |
| 6,596,654 B1 | 7/2003 | Bayman et al. |
| 6,602,434 B1 | 8/2003 | Hung et al. |
| 6,602,806 B1 | 8/2003 | Xia et al. |
| 6,603,269 B1 | 8/2003 | Vo et al. |
| 6,605,874 B2 | 8/2003 | Leu et al. |
| 6,616,967 B1 | 9/2003 | Test |
| 6,627,532 B1 | 9/2003 | Gaillard et al. |
| 6,635,575 B1 | 10/2003 | Xia et al. |
| 6,635,578 B1 | 10/2003 | Xu et al. |
| 6,638,810 B2 | 10/2003 | Bakli et al. |
| 6,645,301 B2 | 11/2003 | Sainty et al. |
| 6,645,550 B1 | 11/2003 | Cheung et al. |
| 6,656,831 B1 | 12/2003 | Lee et al. |
| 6,656,837 B2 | 12/2003 | Xu et al. |
| 6,656,848 B1 | 12/2003 | Scanlan et al. |
| 6,663,715 B1 | 12/2003 | Yuda et al. |
| 6,677,242 B1 | 1/2004 | Liu et al. |
| 6,679,981 B1 | 1/2004 | Pan et al. |
| 6,688,375 B1 | 2/2004 | Turner |
| 6,713,356 B1 | 3/2004 | Skotnicki et al. |
| 6,713,835 B1 | 3/2004 | Horak et al. |
| 6,717,189 B2 | 4/2004 | Inoue et al. |
| 6,720,213 B1 | 4/2004 | Gambino et al. |
| 6,736,147 B2 | 5/2004 | Satoh et al. |
| 6,736,987 B1 | 5/2004 | Cho |
| 6,740,585 B2 | 5/2004 | Yoon et al. |
| 6,740,977 B2 | 5/2004 | Ahn et al. |
| 6,743,473 B1 | 6/2004 | Parkhe et al. |
| 6,743,732 B1 | 6/2004 | Lin et al. |
| 6,756,235 B1 | 6/2004 | Liu et al. |
| 6,759,261 B2 | 7/2004 | Shimokohbe et al. |
| 6,762,127 B2 | 7/2004 | Boiteux et al. |
| 6,762,435 B2 | 7/2004 | Towle |
| 6,764,958 B1 | 7/2004 | Nemani et al. |
| 6,765,273 B1 | 7/2004 | Chau et al. |
| 6,767,834 B2 | 7/2004 | Chung et al. |
| 6,768,079 B2 | 7/2004 | Kosakai |
| 6,770,166 B1 | 8/2004 | Fisher |
| 6,772,827 B2 | 8/2004 | Keller et al. |
| 6,792,889 B2 | 9/2004 | Nakano et al. |
| 6,794,290 B1 | 9/2004 | Papasouliotis et al. |
| 6,794,311 B2 | 9/2004 | Huang et al. |
| 6,796,314 B1 | 9/2004 | Graff et al. |
| 6,797,189 B2 | 9/2004 | Hung et al. |
| 6,800,336 B1 | 10/2004 | Fornsel et al. |
| 6,800,830 B2 | 10/2004 | Mahawili |
| 6,802,944 B2 | 10/2004 | Ahmad et al. |
| 6,808,564 B2 | 10/2004 | Dietze |
| 6,808,747 B1 | 10/2004 | Shih et al. |
| 6,808,748 B2 | 10/2004 | Kapoor et al. |
| 6,815,633 B1 | 11/2004 | Chen et al. |
| 6,821,571 B2 | 11/2004 | Huang |
| 6,823,589 B2 | 11/2004 | White et al. |
| 6,828,241 B2 | 12/2004 | Kholodenko et al. |
| 6,830,624 B2 | 12/2004 | Janakiraman et al. |
| 6,835,995 B2 | 12/2004 | Li |
| 6,846,745 B1 | 1/2005 | Papasouliotis et al. |
| 6,849,854 B2 | 2/2005 | Sainty |
| 6,852,550 B2 | 2/2005 | Tuttle et al. |
| 6,852,584 B1 | 2/2005 | Chen et al. |
| 6,853,533 B2 | 2/2005 | Parkhe et al. |
| 6,858,153 B2 | 2/2005 | Bjorkman et al. |
| 6,861,097 B1 | 3/2005 | Goosey et al. |
| 6,861,332 B2 | 3/2005 | Park et al. |
| 6,869,880 B2 | 3/2005 | Krishnaraj et al. |
| 6,875,280 B2 | 4/2005 | Ikeda et al. |
| 6,878,206 B2 | 4/2005 | Tzu et al. |
| 6,879,981 B2 | 4/2005 | Rothschild et al. |
| 6,886,491 B2 | 5/2005 | Kim et al. |
| 6,892,669 B2 | 5/2005 | Xu et al. |
| 6,893,967 B1 | 5/2005 | Wright et al. |
| 6,897,532 B1 | 5/2005 | Schwarz et al. |
| 6,900,596 B2 | 5/2005 | Yang et al. |
| 6,903,511 B2 | 6/2005 | Chistyakov |
| 6,908,862 B2 | 6/2005 | Li et al. |
| 6,911,112 B2 | 6/2005 | An |
| 6,911,401 B2 | 6/2005 | Khandan et al. |
| 6,916,399 B1 | 7/2005 | Rozenzon et al. |
| 6,921,556 B2 | 7/2005 | Shimizu et al. |
| 6,924,191 B2 | 8/2005 | Liu et al. |
| 6,930,047 B2 | 8/2005 | Yamazaki |
| 6,935,269 B2 | 8/2005 | Lee et al. |
| 6,942,753 B2 | 9/2005 | Choi et al. |
| 6,946,033 B2 | 9/2005 | Tsuei et al. |
| 6,951,821 B2 | 10/2005 | Hamelin et al. |
| 6,958,175 B2 | 10/2005 | Sakamoto et al. |
| 6,958,286 B2 | 10/2005 | Chen et al. |
| 6,995,073 B2 | 2/2006 | Liou |
| 7,017,269 B2 | 3/2006 | White et al. |
| 7,018,941 B2 | 3/2006 | Cui et al. |
| 7,030,034 B2 | 4/2006 | Fucsko et al. |
| 7,049,200 B2 | 5/2006 | Arghavani et al. |
| 7,052,553 B1 | 5/2006 | Shih et al. |
| 7,071,532 B2 | 7/2006 | Geffken et al. |
| 7,084,070 B1 | 8/2006 | Lee et al. |
| 7,115,525 B2 | 10/2006 | Abatchev et al. |
| 7,122,949 B2 | 10/2006 | Strikovski |
| 7,138,767 B2 | 11/2006 | Chen et al. |
| 7,145,725 B2 | 12/2006 | Hasel et al. |
| 7,148,155 B1 | 12/2006 | Tarafdar et al. |
| 7,166,233 B2 | 1/2007 | Johnson et al. |
| 7,183,214 B2 | 2/2007 | Nam et al. |
| 7,196,342 B2 | 3/2007 | Ershov et al. |
| 7,226,805 B2 | 6/2007 | Hallin et al. |
| 7,235,137 B2 | 6/2007 | Kitayama et al. |

(56) References Cited

U.S. PATENT DOCUMENTS

| | | |
|---|---|---|
| 7,244,474 B2 | 7/2007 | Hanawa et al. |
| 7,252,011 B2 | 8/2007 | Traverso |
| 7,252,716 B2 | 8/2007 | Kim et al. |
| 7,253,123 B2 | 8/2007 | Arghavani et al. |
| 7,256,370 B2 | 8/2007 | Guiver |
| 7,274,004 B2 | 9/2007 | Benjamin et al. |
| 7,288,482 B2 | 10/2007 | Panda et al. |
| 7,291,360 B2 | 11/2007 | Hanawa et al. |
| 7,316,761 B2 | 1/2008 | Doan et al. |
| 7,329,608 B2 | 2/2008 | Babayan et al. |
| 7,341,633 B2 | 3/2008 | Lubomirsky et al. |
| 7,344,912 B1 | 3/2008 | Okoroanyanwu |
| 7,358,192 B2 | 4/2008 | Merry et al. |
| 7,361,865 B2 | 4/2008 | Maki et al. |
| 7,364,956 B2 | 4/2008 | Saito |
| 7,365,016 B2 | 4/2008 | Ouellet et al. |
| 7,396,480 B2 | 7/2008 | Kao et al. |
| 7,396,773 B1 | 7/2008 | Blosse et al. |
| 7,416,989 B1 | 8/2008 | Liu et al. |
| 7,465,358 B2 | 12/2008 | Weidman et al. |
| 7,465,953 B1 | 12/2008 | Koh et al. |
| 7,468,319 B2 | 12/2008 | Lee |
| 7,479,303 B2 | 1/2009 | Byun et al. |
| 7,484,473 B2 | 2/2009 | Keller et al. |
| 7,488,688 B2 | 2/2009 | Chung et al. |
| 7,494,545 B2 | 2/2009 | Lam et al. |
| 7,500,445 B2 | 3/2009 | Zhao et al. |
| 7,513,214 B2 | 4/2009 | Okumura et al. |
| 7,520,957 B2 | 4/2009 | Kao et al. |
| 7,553,756 B2 | 6/2009 | Hayashi et al. |
| 7,575,007 B2 | 8/2009 | Tang et al. |
| 7,581,511 B2 | 9/2009 | Mardian et al. |
| 7,604,708 B2 | 10/2009 | Wood et al. |
| 7,611,980 B2 | 11/2009 | Wells |
| 7,628,897 B2 | 12/2009 | Mungekar et al. |
| 7,658,799 B2 | 2/2010 | Ishikawa et al. |
| 7,682,518 B2 | 3/2010 | Chandrachood et al. |
| 7,695,590 B2 | 4/2010 | Hanawa et al. |
| 7,708,859 B2 | 5/2010 | Huang et al. |
| 7,722,925 B2 | 5/2010 | White et al. |
| 7,723,221 B2 | 5/2010 | Hayashi |
| 7,749,326 B2 | 7/2010 | Kim et al. |
| 7,785,672 B2 | 8/2010 | Choi et al. |
| 7,790,634 B2 | 9/2010 | Munro et al. |
| 7,806,077 B2 | 10/2010 | Lee et al. |
| 7,806,078 B2 | 10/2010 | Yoshida |
| 7,807,578 B2 | 10/2010 | Bencher et al. |
| 7,825,038 B2 | 11/2010 | Ingle et al. |
| 7,837,828 B2 | 11/2010 | Ikeda et al. |
| 7,845,309 B2 | 12/2010 | Condrashoff et al. |
| 7,867,926 B2 | 1/2011 | Satoh et al. |
| 7,915,139 B1 | 3/2011 | Lang et al. |
| 7,922,863 B2 | 4/2011 | Ripley |
| 7,932,181 B2 | 4/2011 | Singh et al. |
| 7,939,422 B2 | 5/2011 | Ingle et al. |
| 7,968,441 B2 | 6/2011 | Xu |
| 7,976,631 B2 | 7/2011 | Burrows |
| 7,977,249 B1 | 7/2011 | Liu |
| 7,981,806 B2 | 7/2011 | Jung |
| 7,989,365 B2 | 8/2011 | Park et al. |
| 8,008,166 B2 | 8/2011 | Sanchez et al. |
| 8,048,811 B2 | 11/2011 | Feustel et al. |
| 8,058,179 B1 | 11/2011 | Draeger et al. |
| 8,071,482 B2 | 12/2011 | Kawada |
| 8,074,599 B2 | 12/2011 | Choi et al. |
| 8,076,198 B2 | 12/2011 | Lee et al. |
| 8,083,853 B2 | 12/2011 | Choi et al. |
| 8,114,245 B2 | 2/2012 | Ohmi et al. |
| 8,119,530 B2 | 2/2012 | Hori et al. |
| 8,133,349 B1 | 3/2012 | Panagopoulos |
| 8,173,228 B2 | 5/2012 | Choi et al. |
| 8,183,134 B2 | 5/2012 | Wu |
| 8,187,486 B1 | 5/2012 | Liu et al. |
| 8,211,808 B2 | 7/2012 | Sapre et al. |
| 8,216,486 B2 | 7/2012 | Dhindsa |
| 8,222,128 B2 | 7/2012 | Sasaki et al. |
| 8,252,194 B2 | 8/2012 | Kiehlbauch et al. |
| 8,272,346 B2 | 9/2012 | Bettencourt et al. |
| 8,295,089 B2 | 10/2012 | Jeong et al. |
| 8,298,627 B2 | 10/2012 | Minami et al. |
| 8,298,959 B2 | 10/2012 | Cheshire |
| 8,309,440 B2 | 11/2012 | Sanchez et al. |
| 8,312,839 B2 | 11/2012 | Baek |
| 8,313,610 B2 | 11/2012 | Dhindsa |
| 8,328,939 B2 | 12/2012 | Choi et al. |
| 8,329,262 B2 | 12/2012 | Miller et al. |
| 8,336,188 B2 | 12/2012 | Monteen |
| 8,357,435 B2 | 1/2013 | Lubomirsky |
| 8,368,308 B2 | 2/2013 | Banna et al. |
| 8,390,980 B2 | 3/2013 | Sansoni et al. |
| 8,427,067 B2 | 4/2013 | Espiau et al. |
| 8,435,902 B2 | 5/2013 | Tang et al. |
| 8,440,523 B1 | 5/2013 | Guillorn et al. |
| 8,466,073 B2 * | 6/2013 | Wang ................. C23C 16/30 |
| | | 257/E21.277 |
| 8,475,674 B2 | 7/2013 | Thadani et al. |
| 8,480,850 B2 | 7/2013 | Tyler et al. |
| 8,491,805 B2 | 7/2013 | Kushibiki et al. |
| 8,501,629 B2 | 8/2013 | Tang et al. |
| 8,506,713 B2 | 8/2013 | Takagi |
| 8,512,509 B2 | 8/2013 | Bera et al. |
| 8,528,889 B2 | 9/2013 | Sansoni et al. |
| 8,540,844 B2 | 9/2013 | Hudson et al. |
| 8,551,891 B2 * | 10/2013 | Liang .................. C23C 16/345 |
| | | 438/761 |
| 8,573,152 B2 | 11/2013 | De La Llera |
| 8,622,021 B2 | 1/2014 | Taylor et al. |
| 8,623,471 B2 | 1/2014 | Tyler et al. |
| 8,633,423 B2 | 1/2014 | Lin et al. |
| 8,652,298 B2 | 2/2014 | Dhindsa et al. |
| 8,668,836 B2 | 3/2014 | Mizukami et al. |
| 8,679,982 B2 | 3/2014 | Wang et al. |
| 8,679,983 B2 | 3/2014 | Wang et al. |
| 8,691,023 B2 | 4/2014 | Bao et al. |
| 8,702,902 B2 | 4/2014 | Blom et al. |
| 8,741,778 B2 | 6/2014 | Yang et al. |
| 8,747,680 B1 | 6/2014 | Deshpande |
| 8,748,322 B1 | 6/2014 | Fung et al. |
| 8,765,574 B2 | 7/2014 | Zhang et al. |
| 8,771,536 B2 | 7/2014 | Zhang et al. |
| 8,771,539 B2 | 7/2014 | Zhang et al. |
| 8,772,888 B2 | 7/2014 | Jung et al. |
| 8,778,079 B2 | 7/2014 | Begarney et al. |
| 8,801,952 B1 | 8/2014 | Wang et al. |
| 8,802,572 B2 | 8/2014 | Nemani et al. |
| 8,808,563 B2 * | 8/2014 | Wang ................ H01J 37/32357 |
| | | 216/58 |
| 8,815,720 B2 | 8/2014 | Godet et al. |
| 8,846,163 B2 | 9/2014 | Kao et al. |
| 8,869,742 B2 | 10/2014 | Dhindsa |
| 8,871,651 B1 | 10/2014 | Choi et al. |
| 8,888,087 B2 | 11/2014 | Okabe et al. |
| 8,894,767 B2 | 11/2014 | Goradia et al. |
| 8,895,449 B1 | 11/2014 | Zhu et al. |
| 8,900,364 B2 | 12/2014 | Wright |
| 8,921,234 B2 | 12/2014 | Liu et al. |
| 8,927,390 B2 | 1/2015 | Sapre et al. |
| 8,937,017 B2 | 1/2015 | Cheshire et al. |
| 8,951,429 B1 | 2/2015 | Liu et al. |
| 8,956,980 B1 | 2/2015 | Chen et al. |
| 8,969,212 B2 | 3/2015 | Ren et al. |
| 8,970,114 B2 | 3/2015 | Busche et al. |
| 8,980,005 B2 | 3/2015 | Carlson et al. |
| 8,980,758 B1 | 3/2015 | Ling et al. |
| 8,980,763 B2 | 3/2015 | Wang et al. |
| 8,992,723 B2 | 3/2015 | Sorensen et al. |
| 8,999,656 B2 | 4/2015 | Jirstrom et al. |
| 8,999,839 B2 | 4/2015 | Su et al. |
| 8,999,856 B2 | 4/2015 | Zhang et al. |
| 9,012,302 B2 | 4/2015 | Sapre et al. |
| 9,017,481 B1 | 4/2015 | Pettinger et al. |
| 9,023,732 B2 | 5/2015 | Wang et al. |
| 9,023,734 B2 | 5/2015 | Chen et al. |
| 9,034,770 B2 | 5/2015 | Park et al. |

(56) References Cited

U.S. PATENT DOCUMENTS

| | | | |
|---|---|---|---|
| 9,040,422 B2 | 5/2015 | Wang et al. | |
| 9,064,815 B2 | 6/2015 | Zhang et al. | |
| 9,064,816 B2 | 6/2015 | Kim et al. | |
| 9,072,158 B2 | 6/2015 | Ikeda et al. | |
| 9,093,371 B2 | 7/2015 | Wang et al. | |
| 9,093,389 B2 | 7/2015 | Nemani | |
| 9,093,390 B2 | 7/2015 | Wang et al. | |
| 9,111,877 B2 | 8/2015 | Chen et al. | |
| 9,111,907 B2 | 8/2015 | Kamineni | |
| 9,114,438 B2 | 8/2015 | Hoinkis et al. | |
| 9,117,855 B2 | 8/2015 | Cho et al. | |
| 9,132,436 B2 | 9/2015 | Liang et al. | |
| 9,136,273 B1 | 9/2015 | Purayath et al. | |
| 9,144,147 B2 | 9/2015 | Yang et al. | |
| 9,153,442 B2 | 10/2015 | Wang et al. | |
| 9,159,606 B1 | 10/2015 | Purayath et al. | |
| 9,165,783 B2 | 10/2015 | Nemani et al. | |
| 9,165,786 B1* | 10/2015 | Purayath | H01L 21/31116 |
| 9,184,055 B2 | 11/2015 | Wang et al. | |
| 9,190,290 B2* | 11/2015 | Xue | H01L 21/31116 |
| 9,190,293 B2 | 11/2015 | Wang et al. | |
| 9,190,302 B2 | 11/2015 | Ni | |
| 9,202,708 B1* | 12/2015 | Chen | H01J 37/32357 |
| 9,209,012 B2 | 12/2015 | Chen et al. | |
| 9,236,265 B2 | 1/2016 | Korolik et al. | |
| 9,236,266 B2 | 1/2016 | Zhang et al. | |
| 9,240,315 B1 | 1/2016 | Hsieh et al. | |
| 9,245,762 B2 | 1/2016 | Zhang et al. | |
| 9,263,278 B2 | 2/2016 | Purayath et al. | |
| 9,269,590 B2 | 2/2016 | Luere et al. | |
| 9,275,834 B1* | 3/2016 | Park | H01J 37/3244 |
| 9,287,095 B2 | 3/2016 | Nguyen et al. | |
| 9,287,134 B2 | 3/2016 | Wang et al. | |
| 9,293,568 B2 | 3/2016 | Ko | |
| 9,299,537 B2 | 3/2016 | Kobayashi et al. | |
| 9,299,538 B2 | 3/2016 | Kobayashi et al. | |
| 9,299,575 B2 | 3/2016 | Park et al. | |
| 9,299,582 B2* | 3/2016 | Ingle | H01L 21/02071 |
| 9,299,583 B1 | 3/2016 | Wang et al. | |
| 9,309,598 B2* | 4/2016 | Wang | C23F 1/12 |
| 9,324,576 B2 | 4/2016 | Zhang et al. | |
| 9,343,272 B1* | 5/2016 | Pandit | H01J 37/32412 |
| 9,343,327 B2 | 5/2016 | Zhange et al. | |
| 9,343,358 B1* | 5/2016 | Xu | H01L 21/76877 |
| 9,349,605 B1* | 5/2016 | Xu | H01L 21/31116 |
| 9,355,856 B2 | 5/2016 | Wang et al. | |
| 9,355,862 B2 | 5/2016 | Pandit et al. | |
| 9,355,863 B2 | 5/2016 | Chen et al. | |
| 9,355,922 B2 | 5/2016 | Park et al. | |
| 9,362,130 B2* | 6/2016 | Ingle | H01L 21/3065 |
| 9,362,163 B2 | 6/2016 | Danek et al. | |
| 9,368,364 B2 | 6/2016 | Park et al. | |
| 9,373,517 B2 | 6/2016 | Yang et al. | |
| 9,373,522 B1 | 6/2016 | Wang et al. | |
| 9,378,969 B2 | 6/2016 | Hsu et al. | |
| 9,378,978 B2* | 6/2016 | Purayath | H01L 21/32137 |
| 9,384,997 B2 | 7/2016 | Ren et al. | |
| 9,385,028 B2 | 7/2016 | Nemani et al. | |
| 9,390,937 B2 | 7/2016 | Chen et al. | |
| 9,396,961 B2 | 7/2016 | Arghavani et al. | |
| 9,396,989 B2 | 7/2016 | Purayath et al. | |
| 9,406,523 B2* | 8/2016 | Chen | H01L 21/31116 |
| 9,412,608 B2 | 8/2016 | Wang et al. | |
| 9,418,858 B2* | 8/2016 | Wang | H01J 37/32357 |
| 9,425,041 B2 | 8/2016 | Berry et al. | |
| 9,425,058 B2 | 8/2016 | Kim et al. | |
| 9,431,268 B2 | 8/2016 | Lill et al. | |
| 9,437,451 B2 | 9/2016 | Chen et al. | |
| 9,443,749 B2 | 9/2016 | Smith | |
| 9,449,845 B2 | 9/2016 | Liu et al. | |
| 9,449,846 B2 | 9/2016 | Liu et al. | |
| 9,449,850 B2 | 9/2016 | Wang et al. | |
| 9,460,959 B1 | 10/2016 | Xie et al. | |
| 9,466,469 B2 | 10/2016 | Khaja | |
| 9,472,412 B2 | 10/2016 | Zhang et al. | |
| 9,472,417 B2 | 10/2016 | Ingle et al. | |
| 9,478,432 B2* | 10/2016 | Chen | H01L 21/31116 |
| 9,478,433 B1 | 10/2016 | Zhou et al. | |
| 9,478,434 B2 | 10/2016 | Wang et al. | |
| 9,493,879 B2 | 11/2016 | Hoinkis et al. | |
| 9,496,167 B2* | 11/2016 | Purayath | H01L 21/764 |
| 9,499,898 B2 | 11/2016 | Nguyen et al. | |
| 9,502,258 B2* | 11/2016 | Xue | H01L 21/31155 |
| 9,508,529 B2 | 11/2016 | Valcore et al. | |
| 9,520,303 B2 | 12/2016 | Wang et al. | |
| 9,543,163 B2 | 1/2017 | Ling et al. | |
| 9,564,296 B2 | 2/2017 | Kobayashi et al. | |
| 9,564,338 B1* | 2/2017 | Zhang | H01L 21/3065 |
| 9,576,788 B2* | 2/2017 | Liu | H01L 21/02532 |
| 9,576,809 B2 | 2/2017 | Korolik et al. | |
| 9,607,856 B2 | 3/2017 | Wang et al. | |
| 9,613,822 B2 | 4/2017 | Chen et al. | |
| 9,659,753 B2 | 5/2017 | Cho et al. | |
| 9,659,791 B2 | 5/2017 | Wang et al. | |
| 9,659,792 B2 | 5/2017 | Wang et al. | |
| 9,666,449 B2 | 5/2017 | Koval et al. | |
| 9,691,645 B2 | 6/2017 | Ayers | |
| 9,704,723 B2 | 7/2017 | Wang et al. | |
| 9,711,366 B2 | 7/2017 | Ingle et al. | |
| 9,721,789 B1 | 8/2017 | Yang et al. | |
| 9,728,437 B2 | 8/2017 | Tran et al. | |
| 9,741,593 B2 | 8/2017 | Benjaminson et al. | |
| 9,754,800 B2* | 9/2017 | Zhang | H01L 21/32137 |
| 9,768,034 B1* | 9/2017 | Xu | H01L 21/32136 |
| 9,773,648 B2 | 9/2017 | Cho et al. | |
| 9,773,695 B2 | 9/2017 | Purayath et al. | |
| 9,779,956 B1 | 10/2017 | Zhang et al. | |
| 9,822,009 B2 | 11/2017 | Kagaya et al. | |
| 9,831,097 B2* | 11/2017 | Ingle | H01L 21/3065 |
| 9,837,249 B2 | 12/2017 | Kobayashi et al. | |
| 9,837,284 B2* | 12/2017 | Chen | H01L 21/31116 |
| 9,837,286 B2 | 12/2017 | Yang et al. | |
| 9,842,744 B2 | 12/2017 | Zhang et al. | |
| 9,865,484 B1 | 1/2018 | Citla et al. | |
| 9,881,805 B2* | 1/2018 | Li | H01L 21/3065 |
| 9,885,117 B2 | 2/2018 | Lubomirsky et al. | |
| 9,887,096 B2 | 2/2018 | Park et al. | |
| 9,903,020 B2 | 2/2018 | Kim et al. | |
| 9,934,942 B1 | 4/2018 | Lubomirsky | |
| 9,947,549 B1 | 4/2018 | Park et al. | |
| 9,966,240 B2 | 5/2018 | Park et al. | |
| 9,978,564 B2 | 5/2018 | Liang et al. | |
| 9,991,134 B2 | 6/2018 | Wang et al. | |
| 2001/0006093 A1 | 7/2001 | Tabuchi | |
| 2001/0008803 A1 | 7/2001 | Takamatsu et al. | |
| 2001/0015261 A1 | 8/2001 | Kobayashi et al. | |
| 2001/0028093 A1 | 10/2001 | Yamazaki et al. | |
| 2001/0028922 A1 | 10/2001 | Sandhu | |
| 2001/0029891 A1 | 10/2001 | Oh et al. | |
| 2001/0030366 A1 | 10/2001 | Nakano et al. | |
| 2001/0034106 A1 | 10/2001 | Moise et al. | |
| 2001/0034121 A1 | 10/2001 | Fu et al. | |
| 2001/0035124 A1 | 11/2001 | Okayama et al. | |
| 2001/0036706 A1 | 11/2001 | Kitamura | |
| 2001/0037856 A1 | 11/2001 | Park | |
| 2001/0037941 A1 | 11/2001 | Thompson | |
| 2001/0039921 A1 | 11/2001 | Rolfson et al. | |
| 2001/0042512 A1 | 11/2001 | Xu et al. | |
| 2001/0042799 A1 | 11/2001 | Kim et al. | |
| 2001/0047760 A1 | 12/2001 | Moslehi | |
| 2001/0053585 A1 | 12/2001 | Kikuchi et al. | |
| 2001/0053610 A1 | 12/2001 | Athavale | |
| 2001/0054381 A1 | 12/2001 | Umotoy et al. | |
| 2001/0054387 A1 | 12/2001 | Frankel et al. | |
| 2002/0000202 A1 | 1/2002 | Yuda et al. | |
| 2002/0001778 A1 | 1/2002 | Latchford et al. | |
| 2002/0009560 A1 | 1/2002 | Ozono | |
| 2002/0009885 A1 | 1/2002 | Brankner et al. | |
| 2002/0011210 A1 | 1/2002 | Satoh et al. | |
| 2002/0011214 A1 | 1/2002 | Kamarehi et al. | |
| 2002/0016080 A1 | 2/2002 | Khan et al. | |
| 2002/0016085 A1 | 2/2002 | Huang et al. | |
| 2002/0023899 A1 | 2/2002 | Khater et al. | |
| 2002/0028582 A1 | 3/2002 | Nallan et al. | |

(56) References Cited

U.S. PATENT DOCUMENTS

| | | |
|---|---|---|
| 2002/0028585 A1 | 3/2002 | Chung et al. |
| 2002/0029747 A1 | 3/2002 | Powell et al. |
| 2002/0033233 A1 | 3/2002 | Savas |
| 2002/0036143 A1 | 3/2002 | Segawa et al. |
| 2002/0040764 A1 | 4/2002 | Kwan et al. |
| 2002/0040766 A1 | 4/2002 | Takahashi |
| 2002/0043690 A1 | 4/2002 | Doyle et al. |
| 2002/0045966 A1 | 4/2002 | Lee et al. |
| 2002/0046991 A1 | 4/2002 | Smith et al. |
| 2002/0054962 A1 | 5/2002 | Huang |
| 2002/0062954 A1 | 5/2002 | Getchel et al. |
| 2002/0069820 A1 | 6/2002 | Yudovsky |
| 2002/0070414 A1 | 6/2002 | Drescher et al. |
| 2002/0074573 A1 | 6/2002 | Takeuchi et al. |
| 2002/0086501 A1 | 7/2002 | O'Donnell et al. |
| 2002/0090781 A1 | 7/2002 | Skotnicki et al. |
| 2002/0090835 A1 | 7/2002 | Chakravarti et al. |
| 2002/0094378 A1 | 7/2002 | O'Donnell |
| 2002/0094591 A1 | 7/2002 | Sill et al. |
| 2002/0096493 A1 | 7/2002 | Hattori |
| 2002/0098681 A1 | 7/2002 | Hu et al. |
| 2002/0106845 A1 | 8/2002 | Chao et al. |
| 2002/0112819 A1 | 8/2002 | Kamarehi et al. |
| 2002/0124867 A1 | 9/2002 | Kim et al. |
| 2002/0129769 A1 | 9/2002 | Kim et al. |
| 2002/0129902 A1 | 9/2002 | Babayan et al. |
| 2002/0144657 A1 | 10/2002 | Chiang et al. |
| 2002/0153808 A1 | 10/2002 | Skotnicki et al. |
| 2002/0164885 A1 | 11/2002 | Lill et al. |
| 2002/0170678 A1 | 11/2002 | Hayashi et al. |
| 2002/0177322 A1 | 11/2002 | Li et al. |
| 2002/0179248 A1 | 12/2002 | Kabansky et al. |
| 2002/0182878 A1 | 12/2002 | Hirose et al. |
| 2002/0187280 A1 | 12/2002 | Johnson et al. |
| 2002/0187655 A1 | 12/2002 | Tan et al. |
| 2003/0003757 A1 | 1/2003 | Naltan et al. |
| 2003/0007910 A1 | 1/2003 | Lazarovich et al. |
| 2003/0010645 A1 | 1/2003 | Ting et al. |
| 2003/0019428 A1 | 1/2003 | Ku et al. |
| 2003/0019580 A1 | 1/2003 | Strang |
| 2003/0026060 A1 | 2/2003 | Hiramatsu et al. |
| 2003/0029566 A1 | 2/2003 | Roth |
| 2003/0029567 A1 | 2/2003 | Dhindsa et al. |
| 2003/0029715 A1 | 2/2003 | Yu et al. |
| 2003/0031905 A1 | 2/2003 | Saito et al. |
| 2003/0032284 A1 | 2/2003 | Enomoto et al. |
| 2003/0038127 A1 | 2/2003 | Liu et al. |
| 2003/0038305 A1 | 2/2003 | Wasshuber |
| 2003/0054608 A1 | 3/2003 | Tseng et al. |
| 2003/0066482 A1 | 4/2003 | Pokharna et al. |
| 2003/0071035 A1 | 4/2003 | Brailove |
| 2003/0072639 A1 | 4/2003 | White et al. |
| 2003/0075808 A1 | 4/2003 | Inoue et al. |
| 2003/0077857 A1 | 4/2003 | Xia et al. |
| 2003/0077909 A1 | 4/2003 | Jiwari |
| 2003/0079686 A1 | 5/2003 | Chen et al. |
| 2003/0087488 A1 | 5/2003 | Fink |
| 2003/0087531 A1 | 5/2003 | Kang et al. |
| 2003/0091938 A1 | 5/2003 | Fairbairn et al. |
| 2003/0094134 A1 | 5/2003 | Minami et al. |
| 2003/0098125 A1 | 5/2003 | An |
| 2003/0109143 A1 | 6/2003 | Hsieh et al. |
| 2003/0116087 A1 | 6/2003 | Nguyen et al. |
| 2003/0116439 A1 | 6/2003 | Seo et al. |
| 2003/0121608 A1 | 7/2003 | Chen et al. |
| 2003/0121609 A1 | 7/2003 | Ohmi et al. |
| 2003/0124465 A1 | 7/2003 | Lee et al. |
| 2003/0124842 A1 | 7/2003 | Hytros et al. |
| 2003/0127049 A1 | 7/2003 | Han et al. |
| 2003/0127740 A1 | 7/2003 | Hsu et al. |
| 2003/0129106 A1 | 7/2003 | Sorensen et al. |
| 2003/0129827 A1 | 7/2003 | Lee et al. |
| 2003/0132319 A1 | 7/2003 | Hytros et al. |
| 2003/0140844 A1 | 7/2003 | Maa et al. |
| 2003/0143328 A1 | 7/2003 | Chen et al. |
| 2003/0148035 A1 | 8/2003 | Lingampalli |
| 2003/0150530 A1 | 8/2003 | Lin et al. |
| 2003/0152691 A1 | 8/2003 | Baude |
| 2003/0159307 A1 | 8/2003 | Sago et al. |
| 2003/0164226 A1 | 9/2003 | Kanno et al. |
| 2003/0168439 A1 | 9/2003 | Kanno et al. |
| 2003/0170945 A1 | 9/2003 | Igeta et al. |
| 2003/0173333 A1 | 9/2003 | Wang et al. |
| 2003/0173347 A1 | 9/2003 | Guiver |
| 2003/0173675 A1 | 9/2003 | Watanabe |
| 2003/0181040 A1 | 9/2003 | Ivanov et al. |
| 2003/0183244 A1 | 10/2003 | Rossman |
| 2003/0190426 A1 | 10/2003 | Padhi et al. |
| 2003/0196760 A1 | 10/2003 | Tyler et al. |
| 2003/0199170 A1 | 10/2003 | Li |
| 2003/0200929 A1 | 10/2003 | Otsuki |
| 2003/0205329 A1 | 11/2003 | Gujer et al. |
| 2003/0205479 A1 | 11/2003 | Lin et al. |
| 2003/0209323 A1 | 11/2003 | Yokogaki et al. |
| 2003/0215570 A1 | 11/2003 | Seutter et al. |
| 2003/0215963 A1 | 11/2003 | AmRhein et al. |
| 2003/0216044 A1 | 11/2003 | Lin et al. |
| 2003/0221780 A1 | 12/2003 | Lei et al. |
| 2003/0224217 A1 | 12/2003 | Byun et al. |
| 2003/0224617 A1 | 12/2003 | Baek et al. |
| 2003/0230385 A1 | 12/2003 | Bach et al. |
| 2004/0005726 A1 | 1/2004 | Huang |
| 2004/0018304 A1 | 1/2004 | Chung et al. |
| 2004/0020801 A1 | 2/2004 | Solling |
| 2004/0026371 A1 | 2/2004 | Nguyen et al. |
| 2004/0033678 A1 | 2/2004 | Arghavani et al. |
| 2004/0033684 A1 | 2/2004 | Li |
| 2004/0050328 A1 | 3/2004 | Kumagai et al. |
| 2004/0058070 A1 | 3/2004 | Takeuchi et al. |
| 2004/0058293 A1 | 3/2004 | Nguyen et al. |
| 2004/0060514 A1 | 4/2004 | Janakiraman et al. |
| 2004/0061447 A1 | 4/2004 | Saigusa et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0076529 A1 | 4/2004 | Gnauck et al. |
| 2004/0083967 A1 | 5/2004 | Yuda et al. |
| 2004/0087139 A1 | 5/2004 | Yeh et al. |
| 2004/0092063 A1 | 5/2004 | Okumura |
| 2004/0099285 A1 | 5/2004 | Wange et al. |
| 2004/0099378 A1 | 5/2004 | Kim et al. |
| 2004/0101667 A1 | 5/2004 | O'Loughlin et al. |
| 2004/0107908 A1 | 6/2004 | Collins et al. |
| 2004/0108067 A1 | 6/2004 | Fischione et al. |
| 2004/0108068 A1 | 6/2004 | Senzaki et al. |
| 2004/0115876 A1 | 6/2004 | Goundar et al. |
| 2004/0124280 A1 | 7/2004 | Shih et al. |
| 2004/0129671 A1 | 7/2004 | Ji et al. |
| 2004/0137161 A1 | 7/2004 | Segawa et al. |
| 2004/0140053 A1 | 7/2004 | Srivastava et al. |
| 2004/0144311 A1 | 7/2004 | Chen et al. |
| 2004/0144490 A1 | 7/2004 | Zhao et al. |
| 2004/0147126 A1 | 7/2004 | Yamashita et al. |
| 2004/0149223 A1 | 8/2004 | Collison et al. |
| 2004/0149394 A1 | 8/2004 | Doan et al. |
| 2004/0152342 A1 | 8/2004 | Li |
| 2004/0154535 A1 | 8/2004 | Chen et al. |
| 2004/0157444 A1 | 8/2004 | Chiu |
| 2004/0161921 A1 | 8/2004 | Ryu |
| 2004/0175913 A1 | 9/2004 | Johnson et al. |
| 2004/0175929 A1 | 9/2004 | Schmitt et al. |
| 2004/0182315 A1 | 9/2004 | Laflamme et al. |
| 2004/0187787 A1 | 9/2004 | Dawson |
| 2004/0192032 A1 | 9/2004 | Ohmori et al. |
| 2004/0194799 A1 | 10/2004 | Kim et al. |
| 2004/0195216 A1 | 10/2004 | Strang |
| 2004/0200499 A1 | 10/2004 | Harvey |
| 2004/0211357 A1 | 10/2004 | Gadgil et al. |
| 2004/0219723 A1 | 11/2004 | Peng et al. |
| 2004/0219737 A1 | 11/2004 | Quon |
| 2004/0219789 A1 | 11/2004 | Wood et al. |
| 2004/0221809 A1 | 11/2004 | Ohmi et al. |
| 2004/0231706 A1 | 11/2004 | Bhatnagar et al. |
| 2004/0237897 A1 | 12/2004 | Hanawa et al. |

(56) References Cited

U.S. PATENT DOCUMENTS

| | | |
|---|---|---|
| 2004/0263827 A1 | 12/2004 | Xu |
| 2005/0000432 A1 | 1/2005 | Keller et al. |
| 2005/0001276 A1 | 1/2005 | Gao et al. |
| 2005/0003676 A1 | 1/2005 | Ho et al. |
| 2005/0009340 A1 | 1/2005 | Saijo et al. |
| 2005/0009358 A1 | 1/2005 | Choi et al. |
| 2005/0026430 A1 | 2/2005 | Kim et al. |
| 2005/0026431 A1 | 2/2005 | Kazumi et al. |
| 2005/0035455 A1 | 2/2005 | Hu et al. |
| 2005/0039679 A1 | 2/2005 | Kleshock |
| 2005/0051094 A1 | 3/2005 | Schaepkens et al. |
| 2005/0056218 A1 | 3/2005 | Sun et al. |
| 2005/0073051 A1 | 4/2005 | Yamamoto et al. |
| 2005/0079706 A1 | 4/2005 | Kumar et al. |
| 2005/0087517 A1 | 4/2005 | Ott et al. |
| 2005/0090078 A1 | 4/2005 | Ishihara |
| 2005/0090120 A1 | 4/2005 | Hasegawa et al. |
| 2005/0098111 A1 | 5/2005 | Shimizu et al. |
| 2005/0103267 A1 | 5/2005 | Hur et al. |
| 2005/0105991 A1 | 5/2005 | Hofmeister et al. |
| 2005/0109279 A1 | 5/2005 | Suzuki |
| 2005/0112876 A1 | 5/2005 | Wu |
| 2005/0112901 A1 | 5/2005 | Ji et al. |
| 2005/0123690 A1 | 6/2005 | Derderian et al. |
| 2005/0136188 A1 | 6/2005 | Chang |
| 2005/0145341 A1 | 7/2005 | Suzuki |
| 2005/0164479 A1 | 7/2005 | Perng et al. |
| 2005/0167394 A1 | 8/2005 | Liu et al. |
| 2005/0176258 A1 | 8/2005 | Hirose et al. |
| 2005/0178746 A1 | 8/2005 | Gorin |
| 2005/0181588 A1 | 8/2005 | Kim |
| 2005/0183666 A1 | 8/2005 | Tsuji et al. |
| 2005/0194094 A1 | 9/2005 | Yasaka |
| 2005/0196967 A1 | 9/2005 | Savas et al. |
| 2005/0199489 A1 | 9/2005 | Stevens et al. |
| 2005/0205110 A1 | 9/2005 | Kao et al. |
| 2005/0205862 A1 | 9/2005 | Koemtzopoulos et al. |
| 2005/0208215 A1 | 9/2005 | Eguchi et al. |
| 2005/0208217 A1 | 9/2005 | Shinriki et al. |
| 2005/0214477 A1 | 9/2005 | Hanawa et al. |
| 2005/0218507 A1 | 10/2005 | Kao et al. |
| 2005/0219786 A1 | 10/2005 | Brown et al. |
| 2005/0221552 A1 | 10/2005 | Kao et al. |
| 2005/0224181 A1 | 10/2005 | Merry et al. |
| 2005/0230350 A1 | 10/2005 | Kao et al. |
| 2005/0236694 A1 | 10/2005 | Wu et al. |
| 2005/0238807 A1 | 10/2005 | Lin et al. |
| 2005/0239282 A1 | 10/2005 | Chen et al. |
| 2005/0251990 A1 | 11/2005 | Choi et al. |
| 2005/0266622 A1 | 12/2005 | Arghavani et al. |
| 2005/0266650 A1 | 12/2005 | Ahn et al. |
| 2005/0266691 A1 | 12/2005 | Gu et al. |
| 2005/0269030 A1 | 12/2005 | Kent et al. |
| 2005/0274324 A1 | 12/2005 | Takahashi et al. |
| 2005/0279454 A1 | 12/2005 | Snijders |
| 2005/0283321 A1 | 12/2005 | Yue et al. |
| 2005/0287755 A1 | 12/2005 | Bachmann |
| 2005/0287771 A1 | 12/2005 | Seamons et al. |
| 2006/0000802 A1 | 1/2006 | Kumar et al. |
| 2006/0000805 A1 | 1/2006 | Todorow et al. |
| 2006/0005856 A1 | 1/2006 | Sun et al. |
| 2006/0005930 A1 | 1/2006 | Ikeda et al. |
| 2006/0006057 A1 | 1/2006 | Laermer |
| 2006/0008676 A1 | 1/2006 | Ebata et al. |
| 2006/0011298 A1 | 1/2006 | Lim et al. |
| 2006/0011299 A1 | 1/2006 | Condrashoff et al. |
| 2006/0016783 A1 | 1/2006 | Wu et al. |
| 2006/0019456 A1 | 1/2006 | Bu et al. |
| 2006/0019477 A1 | 1/2006 | Hanawa et al. |
| 2006/0019486 A1 | 1/2006 | Yu et al. |
| 2006/0021574 A1 | 2/2006 | Armour et al. |
| 2006/0021701 A1 | 2/2006 | Tobe et al. |
| 2006/0021703 A1 | 2/2006 | Umotoy et al. |
| 2006/0024954 A1 | 2/2006 | Wu et al. |
| 2006/0024956 A1 | 2/2006 | Zhijian et al. |
| 2006/0033678 A1 | 2/2006 | Lubomirsky et al. |
| 2006/0040055 A1 | 2/2006 | Nguyen et al. |
| 2006/0043066 A1 | 3/2006 | Kamp |
| 2006/0046412 A1 | 3/2006 | Nguyen et al. |
| 2006/0046419 A1 | 3/2006 | Sandhu et al. |
| 2006/0046470 A1 | 3/2006 | Becknell |
| 2006/0051966 A1 | 3/2006 | Or et al. |
| 2006/0051968 A1 | 3/2006 | Joshi et al. |
| 2006/0054184 A1 | 3/2006 | Mozetic et al. |
| 2006/0057828 A1 | 3/2006 | Omura et al. |
| 2006/0060942 A1 | 3/2006 | Minixhofer et al. |
| 2006/0065629 A1 | 3/2006 | Chen et al. |
| 2006/0073349 A1 | 4/2006 | Aihara et al. |
| 2006/0076108 A1 | 4/2006 | Holland et al. |
| 2006/0087644 A1 | 4/2006 | McMillin et al. |
| 2006/0090700 A1 | 5/2006 | Satoh et al. |
| 2006/0093756 A1 | 5/2006 | Rajagopalan et al. |
| 2006/0097397 A1 | 5/2006 | Russell et al. |
| 2006/0102076 A1 | 5/2006 | Smith et al. |
| 2006/0102587 A1 | 5/2006 | Kimura |
| 2006/0118178 A1 | 6/2006 | Desbiolles et al. |
| 2006/0118240 A1 | 6/2006 | Holber et al. |
| 2006/0121724 A1 | 6/2006 | Yue et al. |
| 2006/0124151 A1 | 6/2006 | Yamasaki et al. |
| 2006/0124242 A1 | 6/2006 | Kanarik et al. |
| 2006/0130971 A1 | 6/2006 | Chang et al. |
| 2006/0151115 A1 | 7/2006 | Kim et al. |
| 2006/0157449 A1 | 7/2006 | Takahashi et al. |
| 2006/0162661 A1 | 7/2006 | Jung et al. |
| 2006/0166107 A1 | 7/2006 | Chen et al. |
| 2006/0166515 A1 | 7/2006 | Karim et al. |
| 2006/0169327 A1 | 8/2006 | Shajii et al. |
| 2006/0178008 A1 | 8/2006 | Yeh et al. |
| 2006/0183270 A1 | 8/2006 | Humpston |
| 2006/0185592 A1 | 8/2006 | Matsuura |
| 2006/0191479 A1 | 8/2006 | Mizukami et al. |
| 2006/0191637 A1 | 8/2006 | Zajac et al. |
| 2006/0207504 A1 | 9/2006 | Hasebe et al. |
| 2006/0207595 A1 | 9/2006 | Ohmi et al. |
| 2006/0207971 A1 | 9/2006 | Moriya et al. |
| 2006/0210723 A1 | 9/2006 | Ishizaka |
| 2006/0215347 A1 | 9/2006 | Wakabayashi et al. |
| 2006/0216878 A1 | 9/2006 | Lee |
| 2006/0219360 A1 | 10/2006 | Iwasaki |
| 2006/0222481 A1 | 10/2006 | Foree |
| 2006/0226121 A1 | 10/2006 | Aoi |
| 2006/0228889 A1 | 10/2006 | Edelberg et al. |
| 2006/0240661 A1 | 10/2006 | Annapragada et al. |
| 2006/0244107 A1 | 11/2006 | Sugihara |
| 2006/0246217 A1 | 11/2006 | Weidman et al. |
| 2006/0251800 A1 | 11/2006 | Weidman et al. |
| 2006/0251801 A1 | 11/2006 | Weidman et al. |
| 2006/0252252 A1 | 11/2006 | Zhu et al. |
| 2006/0252265 A1 | 11/2006 | Jin et al. |
| 2006/0254716 A1 | 11/2006 | Mosden et al. |
| 2006/0260750 A1 | 11/2006 | Rueger |
| 2006/0261490 A1 | 11/2006 | Su et al. |
| 2006/0264043 A1 | 11/2006 | Stewart et al. |
| 2006/0266288 A1 | 11/2006 | Choi |
| 2006/0286774 A1 | 12/2006 | Singh et al. |
| 2006/0292846 A1 | 12/2006 | Pinto et al. |
| 2007/0022952 A1 | 2/2007 | Ritchie et al. |
| 2007/0025907 A1 | 2/2007 | Rezeq |
| 2007/0039548 A1 | 2/2007 | Johnson |
| 2007/0048977 A1 | 3/2007 | Lee et al. |
| 2007/0051471 A1 | 3/2007 | Kawaguchi et al. |
| 2007/0056925 A1 | 3/2007 | Liu et al. |
| 2007/0062453 A1 | 3/2007 | Ishikawa |
| 2007/0071888 A1 | 3/2007 | Shanmugasundram et al. |
| 2007/0072408 A1 | 3/2007 | Enomoto et al. |
| 2007/0077737 A1 | 4/2007 | Kobayashi et al. |
| 2007/0079758 A1 | 4/2007 | Holland et al. |
| 2007/0090325 A1 | 4/2007 | Hwang et al. |
| 2007/0099428 A1 | 5/2007 | Shamiryan et al. |
| 2007/0099431 A1 | 5/2007 | Li |
| 2007/0099438 A1 | 5/2007 | Ye et al. |
| 2007/0107750 A1 | 5/2007 | Sawin et al. |
| 2007/0108404 A1 | 5/2007 | Stewart et al. |
| 2007/0111519 A1 | 5/2007 | Lubomirsky et al. |

(56) References Cited

U.S. PATENT DOCUMENTS

| | | |
|---|---|---|
| 2007/0117396 A1 | 5/2007 | Wu et al. |
| 2007/0119370 A1 | 5/2007 | Ma et al. |
| 2007/0119371 A1 | 5/2007 | Ma et al. |
| 2007/0123051 A1 | 5/2007 | Arghavani et al. |
| 2007/0128864 A1 | 6/2007 | Ma |
| 2007/0131274 A1 | 6/2007 | Stollwerck et al. |
| 2007/0145023 A1 | 6/2007 | Holber et al. |
| 2007/0154838 A1 | 7/2007 | Lee |
| 2007/0163440 A1 | 7/2007 | Kim et al. |
| 2007/0175861 A1 | 8/2007 | Hwang et al. |
| 2007/0181057 A1 | 8/2007 | Lam et al. |
| 2007/0193515 A1 | 8/2007 | Jeon et al. |
| 2007/0197028 A1 | 8/2007 | Byun et al. |
| 2007/0207275 A1 | 9/2007 | Nowak et al. |
| 2007/0212288 A1 | 9/2007 | Holst |
| 2007/0221620 A1 | 9/2007 | Sakthivel et al. |
| 2007/0227554 A1 | 10/2007 | Satoh et al. |
| 2007/0231109 A1 | 10/2007 | Pak et al. |
| 2007/0232071 A1 | 10/2007 | Balseanu et al. |
| 2007/0235134 A1 | 10/2007 | Limuro |
| 2007/0238199 A1 | 10/2007 | Yamashita |
| 2007/0238321 A1 | 10/2007 | Futase et al. |
| 2007/0243685 A1 | 10/2007 | Jiang et al. |
| 2007/0243714 A1 | 10/2007 | Shin et al. |
| 2007/0254169 A1 | 11/2007 | Kamins et al. |
| 2007/0259467 A1 | 11/2007 | Tweet et al. |
| 2007/0264820 A1 | 11/2007 | Liu |
| 2007/0266946 A1 | 11/2007 | Choi |
| 2007/0277734 A1 | 12/2007 | Lubomirsky et al. |
| 2007/0280816 A1 | 12/2007 | Kurita et al. |
| 2007/0281106 A1 | 12/2007 | Lubomirksy et al. |
| 2007/0287292 A1 | 12/2007 | Li et al. |
| 2007/0296967 A1 | 12/2007 | Gupta et al. |
| 2008/0003836 A1 | 1/2008 | Nishimura et al. |
| 2008/0017104 A1 | 1/2008 | Matyushkin et al. |
| 2008/0020570 A1 | 1/2008 | Naik |
| 2008/0035608 A1 | 2/2008 | Thomas et al. |
| 2008/0044990 A1 | 2/2008 | Lee |
| 2008/0050538 A1 | 2/2008 | Hirata |
| 2008/0063810 A1 | 3/2008 | Park et al. |
| 2008/0075668 A1 | 3/2008 | Goldstein |
| 2008/0081483 A1 | 4/2008 | Wu |
| 2008/0085604 A1 | 4/2008 | Hoshino et al. |
| 2008/0099147 A1 | 5/2008 | Myo et al. |
| 2008/0099431 A1 | 5/2008 | Kumar et al. |
| 2008/0099876 A1 | 5/2008 | Seto |
| 2008/0100222 A1 | 5/2008 | Lewington et al. |
| 2008/0102570 A1 | 5/2008 | Fischer et al. |
| 2008/0102640 A1 | 5/2008 | Hassan et al. |
| 2008/0104782 A1 | 5/2008 | Hughes |
| 2008/0105555 A1 | 5/2008 | Iwazaki et al. |
| 2008/0115726 A1 | 5/2008 | Ingle et al. |
| 2008/0121970 A1 | 5/2008 | Aritome |
| 2008/0124937 A1 | 5/2008 | Xu et al. |
| 2008/0142831 A1 | 6/2008 | Su |
| 2008/0153306 A1 | 6/2008 | Cho et al. |
| 2008/0156771 A1 | 7/2008 | Jeon et al. |
| 2008/0157225 A1 | 7/2008 | Datta et al. |
| 2008/0160210 A1 | 7/2008 | Yang et al. |
| 2008/0169588 A1 | 7/2008 | Shih et al. |
| 2008/0171407 A1 | 7/2008 | Nakabayashi et al. |
| 2008/0173906 A1 | 7/2008 | Zhu |
| 2008/0176412 A1 | 7/2008 | Komeda |
| 2008/0178797 A1 | 7/2008 | Fodor et al. |
| 2008/0178805 A1 | 7/2008 | Paterson et al. |
| 2008/0182381 A1 | 7/2008 | Kiyotoshi |
| 2008/0182382 A1 | 7/2008 | Ingle et al. |
| 2008/0182383 A1 | 7/2008 | Lee et al. |
| 2008/0196666 A1 | 8/2008 | Toshima |
| 2008/0202688 A1 | 8/2008 | Wu et al. |
| 2008/0202892 A1 | 8/2008 | Smith et al. |
| 2008/0216901 A1 | 9/2008 | Chamberlain et al. |
| 2008/0216958 A1 | 9/2008 | Goto et al. |
| 2008/0230519 A1 | 9/2008 | Takahashi |
| 2008/0233709 A1 | 9/2008 | Conti et al. |
| 2008/0236751 A1 | 10/2008 | Aramaki et al. |
| 2008/0254635 A1 | 10/2008 | Benzel et al. |
| 2008/0261404 A1 | 10/2008 | Kozuka et al. |
| 2008/0264337 A1 | 10/2008 | Sano et al. |
| 2008/0268645 A1 | 10/2008 | Kao et al. |
| 2008/0292798 A1 | 11/2008 | Huh et al. |
| 2008/0293248 A1 | 11/2008 | Park et al. |
| 2009/0000743 A1 | 1/2009 | Iizuka |
| 2009/0001480 A1 | 1/2009 | Cheng |
| 2009/0004849 A1 | 1/2009 | Eun |
| 2009/0004873 A1 | 1/2009 | Yang |
| 2009/0014127 A1 | 1/2009 | Shah et al. |
| 2009/0014323 A1 | 1/2009 | Yendler et al. |
| 2009/0014324 A1 | 1/2009 | Kawaguchi et al. |
| 2009/0017227 A1 | 1/2009 | Fu et al. |
| 2009/0036292 A1 | 2/2009 | Sun et al. |
| 2009/0045167 A1 | 2/2009 | Maruyama |
| 2009/0072401 A1 | 3/2009 | Arnold et al. |
| 2009/0081878 A1 | 3/2009 | Dhindsa |
| 2009/0084317 A1 | 4/2009 | Wu et al. |
| 2009/0087960 A1 | 4/2009 | Cho et al. |
| 2009/0087979 A1 | 4/2009 | Raghuram |
| 2009/0095621 A1 | 4/2009 | Kao et al. |
| 2009/0098276 A1 | 4/2009 | Burrows |
| 2009/0098706 A1 | 4/2009 | Kim et al. |
| 2009/0104738 A1 | 4/2009 | Ring et al. |
| 2009/0104782 A1 | 4/2009 | Lu et al. |
| 2009/0111280 A1 | 4/2009 | Kao et al. |
| 2009/0117270 A1 | 5/2009 | Yamasaki et al. |
| 2009/0120464 A1 | 5/2009 | Rasheed et al. |
| 2009/0162647 A1 | 6/2009 | Sun et al. |
| 2009/0170221 A1 | 7/2009 | Jacques et al. |
| 2009/0170331 A1 | 7/2009 | Cheng et al. |
| 2009/0179300 A1 | 7/2009 | Arai |
| 2009/0189246 A1 | 7/2009 | Wu et al. |
| 2009/0189287 A1 | 7/2009 | Yang et al. |
| 2009/0191711 A1 | 7/2009 | Rui et al. |
| 2009/0194233 A1 | 8/2009 | Tamura |
| 2009/0194810 A1 | 8/2009 | Kiyotoshi et al. |
| 2009/0197418 A1 | 8/2009 | Sago |
| 2009/0202721 A1 | 8/2009 | Nogami et al. |
| 2009/0214825 A1 | 8/2009 | Sun et al. |
| 2009/0223928 A1 | 9/2009 | Colpo |
| 2009/0236314 A1 | 9/2009 | Chen |
| 2009/0255902 A1 | 10/2009 | Satoh et al. |
| 2009/0258162 A1 | 10/2009 | Furuta et al. |
| 2009/0269934 A1 | 10/2009 | Kao et al. |
| 2009/0274590 A1 | 11/2009 | Willwerth et al. |
| 2009/0275146 A1 | 11/2009 | Takano et al. |
| 2009/0275205 A1 | 11/2009 | Kiehlbauch et al. |
| 2009/0275206 A1 | 11/2009 | Katz et al. |
| 2009/0277587 A1 | 11/2009 | Lubomirsky et al. |
| 2009/0277874 A1 | 11/2009 | Rui et al. |
| 2009/0280650 A1 | 11/2009 | Lubomirsky et al. |
| 2009/0286400 A1 | 11/2009 | Heo et al. |
| 2009/0293809 A1 | 12/2009 | Cho et al. |
| 2009/0294898 A1 | 12/2009 | Feustel et al. |
| 2009/0317978 A1 | 12/2009 | Higashi |
| 2009/0320756 A1 | 12/2009 | Tanaka |
| 2010/0000683 A1 | 1/2010 | Kadkhodayan et al. |
| 2010/0003824 A1 | 1/2010 | Kadkhodayan et al. |
| 2010/0022030 A1 | 1/2010 | Ditizio |
| 2010/0025370 A1 | 2/2010 | Dieguez-Campo et al. |
| 2010/0039747 A1 | 2/2010 | Sansoni |
| 2010/0047080 A1 | 2/2010 | Bruce |
| 2010/0048027 A1 | 2/2010 | Cheng et al. |
| 2010/0055408 A1 | 3/2010 | Lee et al. |
| 2010/0055917 A1 | 3/2010 | Kim |
| 2010/0059889 A1 | 3/2010 | Gosset et al. |
| 2010/0062603 A1 | 3/2010 | Ganguly et al. |
| 2010/0075503 A1 | 3/2010 | Bencher |
| 2010/0081285 A1 | 4/2010 | Chen et al. |
| 2010/0093151 A1 | 4/2010 | Arghavani et al. |
| 2010/0093168 A1 | 4/2010 | Naik |
| 2010/0096367 A1 | 4/2010 | Jeon et al. |
| 2010/0099236 A1 | 4/2010 | Kwon et al. |
| 2010/0099263 A1 | 4/2010 | Kao et al. |
| 2010/0101727 A1 | 4/2010 | Ji |
| 2010/0105209 A1 | 4/2010 | Winniczek et al. |

(56) References Cited

U.S. PATENT DOCUMENTS

| | | |
|---|---|---|
| 2010/0116788 A1 | 5/2010 | Singh et al. |
| 2010/0119843 A1 | 5/2010 | Sun et al. |
| 2010/0129974 A1 | 5/2010 | Futase et al. |
| 2010/0130001 A1 | 5/2010 | Noguchi |
| 2010/0139889 A1 | 6/2010 | Kurita et al. |
| 2010/0144140 A1 | 6/2010 | Chandrashekar et al. |
| 2010/0147219 A1 | 6/2010 | Hsieh et al. |
| 2010/0151149 A1 | 6/2010 | Ovshinsky |
| 2010/0164422 A1 | 7/2010 | Shu et al. |
| 2010/0173499 A1 | 7/2010 | Tao et al. |
| 2010/0178748 A1 | 7/2010 | Subramanian |
| 2010/0178755 A1 | 7/2010 | Lee et al. |
| 2010/0180819 A1 | 7/2010 | Hatanaka et al. |
| 2010/0183825 A1 | 7/2010 | Becker et al. |
| 2010/0187534 A1 | 7/2010 | Nishi et al. |
| 2010/0187588 A1 | 7/2010 | Kim et al. |
| 2010/0187694 A1 | 7/2010 | Yu et al. |
| 2010/0190352 A1 | 7/2010 | Jaiswal |
| 2010/0197143 A1 | 8/2010 | Nishimura |
| 2010/0203739 A1 | 8/2010 | Becker et al. |
| 2010/0207205 A1 | 8/2010 | Grebs et al. |
| 2010/0224324 A1 | 9/2010 | Kasai |
| 2010/0240205 A1 | 9/2010 | Son |
| 2010/0243165 A1 | 9/2010 | Um |
| 2010/0243606 A1 | 9/2010 | Koshimizu |
| 2010/0244204 A1 | 9/2010 | Matsuoka et al. |
| 2010/0252068 A1 | 10/2010 | Kannan et al. |
| 2010/0258913 A1 | 10/2010 | Lue |
| 2010/0267224 A1 | 10/2010 | Choi et al. |
| 2010/0267248 A1 | 10/2010 | Ma et al. |
| 2010/0288369 A1 | 11/2010 | Chang et al. |
| 2010/0294199 A1 | 11/2010 | Tran et al. |
| 2010/0310785 A1 | 12/2010 | Sasakawa et al. |
| 2010/0314005 A1 | 12/2010 | Saito et al. |
| 2010/0330814 A1 | 12/2010 | Yokota et al. |
| 2011/0005607 A1 | 1/2011 | Desbiolles et al. |
| 2011/0005684 A1 | 1/2011 | Hayami et al. |
| 2011/0008950 A1 | 1/2011 | Xu |
| 2011/0011338 A1 | 1/2011 | Chuc et al. |
| 2011/0034035 A1 | 2/2011 | Liang et al. |
| 2011/0039407 A1 | 2/2011 | Nishizuka |
| 2011/0045676 A1 | 2/2011 | Park |
| 2011/0048325 A1 | 3/2011 | Choie et al. |
| 2011/0053380 A1 | 3/2011 | Sapre et al. |
| 2011/0058303 A1 | 3/2011 | Migita |
| 2011/0061810 A1 | 3/2011 | Ganguly et al. |
| 2011/0061812 A1 | 3/2011 | Ganguly et al. |
| 2011/0065276 A1 | 3/2011 | Ganguly et al. |
| 2011/0076401 A1 | 3/2011 | Chao et al. |
| 2011/0081782 A1 | 4/2011 | Liang et al. |
| 2011/0100489 A1 | 5/2011 | Orito |
| 2011/0104393 A1 | 5/2011 | Hilkene et al. |
| 2011/0111596 A1 | 5/2011 | Kanakasabapathy |
| 2011/0114601 A1 | 5/2011 | Lubomirsky et al. |
| 2011/0115378 A1 | 5/2011 | Lubomirsky et al. |
| 2011/0124144 A1 | 5/2011 | Schlemm et al. |
| 2011/0127156 A1 | 6/2011 | Foad et al. |
| 2011/0133650 A1 | 6/2011 | Kim |
| 2011/0140229 A1 | 6/2011 | Rachmady et al. |
| 2011/0143542 A1 | 6/2011 | Feurprier et al. |
| 2011/0146909 A1 | 6/2011 | Shi et al. |
| 2011/0147363 A1 | 6/2011 | Yap et al. |
| 2011/0151674 A1 | 6/2011 | Tang et al. |
| 2011/0151677 A1 | 6/2011 | Wang et al. |
| 2011/0151678 A1 | 6/2011 | Ashtiani et al. |
| 2011/0155181 A1 | 6/2011 | Inatomi |
| 2011/0159690 A1 | 6/2011 | Chandrashekar et al. |
| 2011/0165057 A1 | 7/2011 | Honda et al. |
| 2011/0165347 A1 | 7/2011 | Miller et al. |
| 2011/0165771 A1 | 7/2011 | Ring et al. |
| 2011/0174778 A1 | 7/2011 | Sawada et al. |
| 2011/0180847 A1 | 7/2011 | Ikeda et al. |
| 2011/0195575 A1 | 8/2011 | Wang |
| 2011/0198034 A1 | 8/2011 | Sun et al. |
| 2011/0204025 A1 | 8/2011 | Tahara |
| 2011/0207332 A1 | 8/2011 | Liu et al. |
| 2011/0217851 A1 | 9/2011 | Liang et al. |
| 2011/0226734 A1 | 9/2011 | Sumiya et al. |
| 2011/0227028 A1 | 9/2011 | Sekar et al. |
| 2011/0230008 A1 | 9/2011 | Lakshmanan et al. |
| 2011/0230052 A1 | 9/2011 | Tang et al. |
| 2011/0232737 A1 | 9/2011 | Ruletzki et al. |
| 2011/0232845 A1 | 9/2011 | Riker et al. |
| 2011/0256421 A1 | 10/2011 | Bose et al. |
| 2011/0265884 A1 | 11/2011 | Xu et al. |
| 2011/0265951 A1 | 11/2011 | Xu |
| 2011/0266252 A1 | 11/2011 | Thadani et al. |
| 2011/0266256 A1 | 11/2011 | Cruse et al. |
| 2011/0266682 A1 | 11/2011 | Edelstein et al. |
| 2011/0278260 A1 | 11/2011 | Lai et al. |
| 2011/0287633 A1 | 11/2011 | Lee et al. |
| 2011/0294300 A1 | 12/2011 | Zhang et al. |
| 2011/0298061 A1 | 12/2011 | Siddiqui et al. |
| 2011/0304078 A1 | 12/2011 | Lee et al. |
| 2012/0003782 A1 | 1/2012 | Byun et al. |
| 2012/0009796 A1 | 1/2012 | Cui et al. |
| 2012/0025289 A1 | 2/2012 | Liang et al. |
| 2012/0031559 A1 | 2/2012 | Dhindsa et al. |
| 2012/0034786 A1 | 2/2012 | Dhindsa et al. |
| 2012/0035766 A1 | 2/2012 | Shajii et al. |
| 2012/0037596 A1 | 2/2012 | Eto et al. |
| 2012/0052683 A1 | 3/2012 | Kim et al. |
| 2012/0055402 A1 | 3/2012 | Moriya et al. |
| 2012/0068242 A1 | 3/2012 | Shin et al. |
| 2012/0070982 A1 | 3/2012 | Yu et al. |
| 2012/0070996 A1 | 3/2012 | Hao et al. |
| 2012/0091108 A1 | 4/2012 | Lin et al. |
| 2012/0097330 A1 | 4/2012 | Iyengar et al. |
| 2012/0103518 A1 | 5/2012 | Kakimoto |
| 2012/0104564 A1 | 5/2012 | Won et al. |
| 2012/0119225 A1 | 5/2012 | Shiomi et al. |
| 2012/0122319 A1 | 5/2012 | Shimizu |
| 2012/0129354 A1 | 5/2012 | Luong |
| 2012/0135576 A1 | 5/2012 | Lee et al. |
| 2012/0148369 A1 | 6/2012 | Michalski et al. |
| 2012/0149200 A1 | 6/2012 | Culp et al. |
| 2012/0161405 A1 | 6/2012 | Mohn et al. |
| 2012/0164839 A1 | 6/2012 | Nishimura |
| 2012/0171852 A1 | 7/2012 | Yuan et al. |
| 2012/0180954 A1 | 7/2012 | Yang et al. |
| 2012/0181599 A1 | 7/2012 | Lung |
| 2012/0182808 A1 | 7/2012 | Lue et al. |
| 2012/0196447 A1 | 8/2012 | Yang et al. |
| 2012/0196451 A1 | 8/2012 | Mallick |
| 2012/0202408 A1 | 8/2012 | Shajii et al. |
| 2012/0208361 A1 | 8/2012 | Ha |
| 2012/0211462 A1 | 8/2012 | Zhang et al. |
| 2012/0211722 A1 | 8/2012 | Kellam et al. |
| 2012/0222815 A1 | 9/2012 | Sabri et al. |
| 2012/0223048 A1 | 9/2012 | Paranjpe et al. |
| 2012/0223418 A1 | 9/2012 | Stowers et al. |
| 2012/0225557 A1 | 9/2012 | Serry et al. |
| 2012/0228642 A1 | 9/2012 | Aube et al. |
| 2012/0238102 A1 | 9/2012 | Zhang et al. |
| 2012/0238103 A1 | 9/2012 | Zhang et al. |
| 2012/0238108 A1* | 9/2012 | Chen ............... C23C 16/345 |
| | | 438/765 |
| 2012/0241411 A1 | 9/2012 | Darling et al. |
| 2012/0247390 A1 | 10/2012 | Sawada et al. |
| 2012/0247670 A1 | 10/2012 | Dobashi et al. |
| 2012/0247671 A1 | 10/2012 | Sugawara |
| 2012/0247677 A1 | 10/2012 | Himori et al. |
| 2012/0255491 A1 | 10/2012 | Hahidi |
| 2012/0258600 A1 | 10/2012 | Godet et al. |
| 2012/0267346 A1 | 10/2012 | Kao et al. |
| 2012/0269968 A1 | 10/2012 | Rayner |
| 2012/0282779 A1 | 11/2012 | Arnold et al. |
| 2012/0285619 A1 | 11/2012 | Matyushkin et al. |
| 2012/0285621 A1 | 11/2012 | Tan |
| 2012/0291696 A1 | 11/2012 | Clarke |
| 2012/0292664 A1 | 11/2012 | Kanike |
| 2012/0304933 A1 | 12/2012 | Mai et al. |
| 2012/0309204 A1 | 12/2012 | Kang et al. |

(56) References Cited

U.S. PATENT DOCUMENTS

| | | | |
|---|---|---|---|
| 2012/0309205 A1* | 12/2012 | Wang | C23C 16/30 438/763 |
| 2012/0322015 A1 | 12/2012 | Kim | |
| 2013/0001899 A1 | 1/2013 | Hwang et al. | |
| 2013/0005103 A1 | 1/2013 | Liu et al. | |
| 2013/0005140 A1 | 1/2013 | Jeng et al. | |
| 2013/0012030 A1 | 1/2013 | Lakshmanan et al. | |
| 2013/0012032 A1 | 1/2013 | Liu et al. | |
| 2013/0023062 A1 | 1/2013 | Masuda et al. | |
| 2013/0023124 A1 | 1/2013 | Nemani et al. | |
| 2013/0026135 A1 | 1/2013 | Kim | |
| 2013/0032574 A1 | 2/2013 | Liu et al. | |
| 2013/0034666 A1 | 2/2013 | Liang et al. | |
| 2013/0034968 A1* | 2/2013 | Zhang | H01L 21/31116 438/718 |
| 2013/0037919 A1 | 2/2013 | Sapra et al. | |
| 2013/0045605 A1* | 2/2013 | Wang | H01L 21/3065 438/723 |
| 2013/0052804 A1 | 2/2013 | Song | |
| 2013/0052827 A1* | 2/2013 | Wang | H01J 37/32357 438/694 |
| 2013/0052833 A1 | 2/2013 | Ranjan et al. | |
| 2013/0059440 A1 | 3/2013 | Wang et al. | |
| 2013/0062675 A1 | 3/2013 | Thomas | |
| 2013/0065398 A1 | 3/2013 | Ohsawa et al. | |
| 2013/0082197 A1 | 4/2013 | Yang et al. | |
| 2013/0084654 A1 | 4/2013 | Gaylord et al. | |
| 2013/0087309 A1 | 4/2013 | Volfovski | |
| 2013/0089988 A1* | 4/2013 | Wang | H01J 37/32357 438/719 |
| 2013/0098868 A1 | 4/2013 | Nishimura et al. | |
| 2013/0105303 A1 | 5/2013 | Lubomirsky et al. | |
| 2013/0105948 A1 | 5/2013 | Kewley | |
| 2013/0115372 A1 | 5/2013 | Pavol et al. | |
| 2013/0118686 A1 | 5/2013 | Carducci et al. | |
| 2013/0119016 A1 | 5/2013 | Kagoshima | |
| 2013/0119457 A1 | 5/2013 | Lue et al. | |
| 2013/0119483 A1 | 5/2013 | Alptekin et al. | |
| 2013/0130507 A1 | 5/2013 | Wang et al. | |
| 2013/0150303 A1 | 6/2013 | Kungl et al. | |
| 2013/0155568 A1 | 6/2013 | Todorow et al. | |
| 2013/0161726 A1 | 6/2013 | Kim et al. | |
| 2013/0171810 A1 | 7/2013 | Sun et al. | |
| 2013/0175654 A1 | 7/2013 | Muckenhirn et al. | |
| 2013/0187220 A1 | 7/2013 | Surthi | |
| 2013/0193108 A1 | 8/2013 | Zheng | |
| 2013/0213935 A1 | 8/2013 | Liao et al. | |
| 2013/0217243 A1 | 8/2013 | Underwood et al. | |
| 2013/0224960 A1 | 8/2013 | Payyapilly et al. | |
| 2013/0260533 A1 | 10/2013 | Sapre et al. | |
| 2013/0260564 A1 | 10/2013 | Sapre et al. | |
| 2013/0279066 A1 | 10/2013 | Lubomirsky et al. | |
| 2013/0284369 A1 | 10/2013 | Kobayashi et al. | |
| 2013/0284370 A1 | 10/2013 | Kobayashi et al. | |
| 2013/0284373 A1 | 10/2013 | Sun et al. | |
| 2013/0284374 A1 | 10/2013 | Lubomirsky et al. | |
| 2013/0286530 A1 | 10/2013 | Lin et al. | |
| 2013/0295297 A1 | 11/2013 | Chou et al. | |
| 2013/0298942 A1 | 11/2013 | Ren et al. | |
| 2013/0302980 A1 | 11/2013 | Chandrashekar et al. | |
| 2013/0337655 A1 | 12/2013 | Lee et al. | |
| 2013/0343829 A1 | 12/2013 | Benedetti et al. | |
| 2014/0004707 A1 | 1/2014 | Thedjoisworo et al. | |
| 2014/0004708 A1 | 1/2014 | Thedjoisworo et al. | |
| 2014/0008880 A1 | 1/2014 | Miura et al. | |
| 2014/0020708 A1 | 1/2014 | Kim et al. | |
| 2014/0021673 A1 | 1/2014 | Chen et al. | |
| 2014/0026813 A1 | 1/2014 | Wang et al. | |
| 2014/0053866 A1 | 2/2014 | Baluja et al. | |
| 2014/0057447 A1 | 2/2014 | Yang et al. | |
| 2014/0062285 A1 | 3/2014 | Chen | |
| 2014/0065827 A1 | 3/2014 | Kang et al. | |
| 2014/0065842 A1 | 3/2014 | Anthis et al. | |
| 2014/0080308 A1* | 3/2014 | Chen | H01J 37/32357 438/723 |
| 2014/0080309 A1 | 3/2014 | Park | |
| 2014/0080310 A1* | 3/2014 | Chen | H01J 37/32357 438/724 |
| 2014/0083362 A1 | 3/2014 | Lubomirsky et al. | |
| 2014/0087488 A1 | 3/2014 | Nam et al. | |
| 2014/0097270 A1 | 4/2014 | Liang et al. | |
| 2014/0099794 A1 | 4/2014 | Ingle et al. | |
| 2014/0102367 A1 | 4/2014 | Ishibashi | |
| 2014/0124364 A1 | 5/2014 | Yoo et al. | |
| 2014/0134842 A1 | 5/2014 | Zhange et al. | |
| 2014/0134847 A1 | 5/2014 | Seya | |
| 2014/0141621 A1 | 5/2014 | Ren et al. | |
| 2014/0147126 A1 | 5/2014 | Linnartz et al. | |
| 2014/0152312 A1 | 6/2014 | Snow et al. | |
| 2014/0154668 A1 | 6/2014 | Chou et al. | |
| 2014/0154889 A1 | 6/2014 | Wang et al. | |
| 2014/0165912 A1 | 6/2014 | Kao et al. | |
| 2014/0166617 A1 | 6/2014 | Chen | |
| 2014/0166618 A1 | 6/2014 | Tadigadapa et al. | |
| 2014/0186772 A1 | 7/2014 | Pohlers et al. | |
| 2014/0190410 A1 | 7/2014 | Kim | |
| 2014/0191388 A1 | 7/2014 | Chen | |
| 2014/0199850 A1 | 7/2014 | Kim et al. | |
| 2014/0199851 A1 | 7/2014 | Nemani et al. | |
| 2014/0209245 A1 | 7/2014 | Yamamoto et al. | |
| 2014/0216337 A1 | 8/2014 | Swaminathan et al. | |
| 2014/0225504 A1 | 8/2014 | Kaneko et al. | |
| 2014/0227881 A1 | 8/2014 | Lubomirsky et al. | |
| 2014/0234466 A1 | 8/2014 | Gao et al. | |
| 2014/0248773 A1 | 9/2014 | Tsai et al. | |
| 2014/0248780 A1* | 9/2014 | Ingle | H01L 21/3065 438/745 |
| 2014/0256131 A1 | 9/2014 | Wang et al. | |
| 2014/0256145 A1 | 9/2014 | Abdallah et al. | |
| 2014/0262031 A1 | 9/2014 | Belostotskiy et al. | |
| 2014/0262038 A1 | 9/2014 | Wang et al. | |
| 2014/0263172 A1 | 9/2014 | Xie et al. | |
| 2014/0263272 A1 | 9/2014 | Duan et al. | |
| 2014/0264533 A1 | 9/2014 | Simsek-Ege | |
| 2014/0271097 A1 | 9/2014 | Wang et al. | |
| 2014/0273373 A1 | 9/2014 | Makala et al. | |
| 2014/0273406 A1 | 9/2014 | Wang et al. | |
| 2014/0273451 A1 | 9/2014 | Wang et al. | |
| 2014/0273462 A1 | 9/2014 | Simsek-Ege et al. | |
| 2014/0273487 A1 | 9/2014 | Deshmukh et al. | |
| 2014/0273489 A1 | 9/2014 | Wang et al. | |
| 2014/0273491 A1 | 9/2014 | Zhang et al. | |
| 2014/0273492 A1 | 9/2014 | Anthis et al. | |
| 2014/0273496 A1 | 9/2014 | Kao | |
| 2014/0288528 A1 | 9/2014 | Py et al. | |
| 2014/0302678 A1 | 10/2014 | Paterson et al. | |
| 2014/0302680 A1 | 10/2014 | Singh | |
| 2014/0308758 A1 | 10/2014 | Nemani et al. | |
| 2014/0308816 A1 | 10/2014 | Wang et al. | |
| 2014/0311581 A1 | 10/2014 | Belostotskiy et al. | |
| 2014/0342532 A1 | 11/2014 | Zhu | |
| 2014/0342569 A1 | 11/2014 | Zhu et al. | |
| 2014/0349477 A1 | 11/2014 | Chandrashekar et al. | |
| 2014/0357083 A1 | 12/2014 | Ling et al. | |
| 2014/0361684 A1 | 12/2014 | Ikeda et al. | |
| 2014/0363979 A1 | 12/2014 | Or et al. | |
| 2015/0011096 A1 | 1/2015 | Chandrasekharan et al. | |
| 2015/0014152 A1 | 1/2015 | Hoinkis et al. | |
| 2015/0031211 A1 | 1/2015 | Sapre et al. | |
| 2015/0037980 A1 | 2/2015 | Rha | |
| 2015/0041430 A1 | 2/2015 | Yoshino et al. | |
| 2015/0050812 A1 | 2/2015 | Smith | |
| 2015/0060265 A1 | 3/2015 | Cho et al. | |
| 2015/0064918 A1 | 3/2015 | Ranjan et al. | |
| 2015/0072508 A1 | 3/2015 | Or et al. | |
| 2015/0076110 A1 | 3/2015 | Wu et al. | |
| 2015/0076586 A1 | 3/2015 | Rabkin et al. | |
| 2015/0079797 A1 | 3/2015 | Chen et al. | |
| 2015/0093891 A1 | 4/2015 | Zope | |
| 2015/0118858 A1 | 4/2015 | Takaba | |
| 2015/0126035 A1 | 5/2015 | Diao et al. | |
| 2015/0126039 A1 | 5/2015 | Korolik et al. | |

(56) References Cited

U.S. PATENT DOCUMENTS

| | | | |
|---|---|---|---|
| 2015/0126040 A1* | 5/2015 | Korolik | H01L 21/3065 438/718 |
| 2015/0129541 A1* | 5/2015 | Wang | H01L 21/02071 216/13 |
| 2015/0129545 A1 | 5/2015 | Ingle et al. | |
| 2015/0129546 A1 | 5/2015 | Ingle et al. | |
| 2015/0132953 A1 | 5/2015 | Nowling | |
| 2015/0132968 A1 | 5/2015 | Ren et al. | |
| 2015/0152072 A1 | 6/2015 | Cantat et al. | |
| 2015/0155177 A1 | 6/2015 | Zhang et al. | |
| 2015/0170879 A1 | 6/2015 | Nguyen et al. | |
| 2015/0170920 A1 | 6/2015 | Purayath et al. | |
| 2015/0170924 A1 | 6/2015 | Nguyen et al. | |
| 2015/0170926 A1 | 6/2015 | Michalak | |
| 2015/0170935 A1 | 6/2015 | Wang et al. | |
| 2015/0170943 A1 | 6/2015 | Nguyen et al. | |
| 2015/0171008 A1 | 6/2015 | Luo | |
| 2015/0179464 A1 | 6/2015 | Wang et al. | |
| 2015/0187625 A1 | 7/2015 | Busche et al. | |
| 2015/0200042 A1 | 7/2015 | Ling et al. | |
| 2015/0206764 A1 | 7/2015 | Wang et al. | |
| 2015/0214066 A1 | 7/2015 | Luere et al. | |
| 2015/0214067 A1 | 7/2015 | Zhang et al. | |
| 2015/0214092 A1 | 7/2015 | Purayath et al. | |
| 2015/0214337 A1 | 7/2015 | Ko et al. | |
| 2015/0221541 A1 | 8/2015 | Nemani et al. | |
| 2015/0228456 A1 | 8/2015 | Ye et al. | |
| 2015/0235809 A1 | 8/2015 | Ito et al. | |
| 2015/0235860 A1 | 8/2015 | Tomura et al. | |
| 2015/0235863 A1 | 8/2015 | Chen | |
| 2015/0235865 A1 | 8/2015 | Wang et al. | |
| 2015/0235867 A1 | 8/2015 | Nishizuka | |
| 2015/0247231 A1 | 9/2015 | Nguyen et al. | |
| 2015/0249018 A1 | 9/2015 | Park et al. | |
| 2015/0270140 A1 | 9/2015 | Gupta et al. | |
| 2015/0275361 A1 | 10/2015 | Lubomirsky et al. | |
| 2015/0275375 A1 | 10/2015 | Kim et al. | |
| 2015/0279687 A1* | 10/2015 | Xue | H01L 21/31116 438/705 |
| 2015/0294980 A1 | 10/2015 | Lee et al. | |
| 2015/0332930 A1 | 11/2015 | Wang et al. | |
| 2015/0340225 A1 | 11/2015 | Kim et al. | |
| 2015/0345029 A1 | 12/2015 | Wang et al. | |
| 2015/0357201 A1 | 12/2015 | Chen et al. | |
| 2015/0357205 A1 | 12/2015 | Wang et al. | |
| 2015/0371861 A1 | 12/2015 | Li et al. | |
| 2015/0371864 A1 | 12/2015 | Hsu et al. | |
| 2015/0371865 A1* | 12/2015 | Chen | H01L 21/31116 438/715 |
| 2015/0371866 A1 | 12/2015 | Chen et al. | |
| 2015/0380431 A1 | 12/2015 | Kanamori et al. | |
| 2016/0005572 A1 | 1/2016 | Liang et al. | |
| 2016/0005833 A1 | 1/2016 | Collins et al. | |
| 2016/0027654 A1 | 1/2016 | Kim et al. | |
| 2016/0027673 A1 | 1/2016 | Wang et al. | |
| 2016/0035586 A1 | 2/2016 | Purayath et al. | |
| 2016/0035614 A1 | 2/2016 | Purayath et al. | |
| 2016/0042968 A1* | 2/2016 | Purayath | H01L 21/31116 438/478 |
| 2016/0043099 A1* | 2/2016 | Purayath | H01L 27/11582 438/714 |
| 2016/0056167 A1 | 2/2016 | Wang et al. | |
| 2016/0064212 A1* | 3/2016 | Thedjoiswaro | H01L 21/02063 438/710 |
| 2016/0064233 A1 | 3/2016 | Wang et al. | |
| 2016/0079072 A1 | 3/2016 | Wang et al. | |
| 2016/0086772 A1 | 3/2016 | Khaja | |
| 2016/0086807 A1 | 3/2016 | Park et al. | |
| 2016/0086808 A1 | 3/2016 | Zhang et al. | |
| 2016/0086815 A1 | 3/2016 | Pandit et al. | |
| 2016/0086816 A1 | 3/2016 | Wang et al. | |
| 2016/0093505 A1 | 3/2016 | Chen et al. | |
| 2016/0093506 A1* | 3/2016 | Chen | H01L 21/31116 438/723 |
| 2016/0093737 A1 | 3/2016 | Li et al. | |
| 2016/0104606 A1 | 4/2016 | Park et al. | |
| 2016/0109863 A1 | 4/2016 | Valcore et al. | |
| 2016/0117425 A1 | 4/2016 | Povolny et al. | |
| 2016/0118227 A1 | 4/2016 | Valcore et al. | |
| 2016/0118268 A1 | 4/2016 | Ingle et al. | |
| 2016/0126118 A1 | 5/2016 | Chen et al. | |
| 2016/0133480 A1 | 5/2016 | Ko et al. | |
| 2016/0148805 A1 | 5/2016 | Jongbloed et al. | |
| 2016/0148821 A1 | 5/2016 | Singh et al. | |
| 2016/0163512 A1 | 6/2016 | Lubomirsky | |
| 2016/0163513 A1 | 6/2016 | Lubomirsky | |
| 2016/0172216 A1 | 6/2016 | Marakhtanov et al. | |
| 2016/0181112 A1* | 6/2016 | Xue | H01L 21/31155 438/705 |
| 2016/0181116 A1 | 6/2016 | Berry et al. | |
| 2016/0189933 A1 | 6/2016 | Kobayashi et al. | |
| 2016/0196969 A1 | 7/2016 | Berry et al. | |
| 2016/0196984 A1 | 7/2016 | Lill et al. | |
| 2016/0204009 A1 | 7/2016 | Nguyen et al. | |
| 2016/0218018 A1 | 7/2016 | Lieu et al. | |
| 2016/0222522 A1* | 8/2016 | Wang | C23F 1/12 |
| 2016/0225651 A1 | 8/2016 | Tran et al. | |
| 2016/0225652 A1 | 8/2016 | Tran et al. | |
| 2016/0237570 A1 | 8/2016 | Tan et al. | |
| 2016/0240389 A1 | 8/2016 | Zhang et al. | |
| 2016/0240402 A1 | 8/2016 | Park et al. | |
| 2016/0260588 A1 | 9/2016 | Park et al. | |
| 2016/0260616 A1* | 9/2016 | Li | H01L 21/3065 |
| 2016/0260619 A1 | 9/2016 | Zhang et al. | |
| 2016/0284556 A1* | 9/2016 | Ingle | H01L 21/3065 |
| 2016/0293438 A1 | 10/2016 | Zhou et al. | |
| 2016/0300694 A1 | 10/2016 | Yang et al. | |
| 2016/0307772 A1 | 10/2016 | Choi et al. | |
| 2016/0307773 A1 | 10/2016 | Lee et al. | |
| 2016/0314961 A1* | 10/2016 | Liu | H01L 21/02532 |
| 2016/0314985 A1 | 10/2016 | Yang et al. | |
| 2016/0319452 A1 | 11/2016 | Eidschun et al. | |
| 2016/0343548 A1 | 11/2016 | Howald et al. | |
| 2017/0040175 A1 | 2/2017 | Xu et al. | |
| 2017/0040190 A1 | 2/2017 | Benjaminson et al. | |
| 2017/0040191 A1 | 2/2017 | Benjaminson et al. | |
| 2017/0040207 A1 | 2/2017 | Purayath | |
| 2017/0040214 A1 | 2/2017 | Lai et al. | |
| 2017/0062184 A1 | 3/2017 | Tran et al. | |
| 2017/0110290 A1 | 4/2017 | Kobayashi et al. | |
| 2017/0110335 A1 | 4/2017 | Yang et al. | |
| 2017/0110475 A1 | 4/2017 | Liu et al. | |
| 2017/0133202 A1 | 5/2017 | Berry | |
| 2017/0178894 A1* | 6/2017 | Stone | H01L 21/02057 |
| 2017/0178924 A1 | 6/2017 | Chen et al. | |
| 2017/0226637 A1 | 8/2017 | Lubomirsky et al. | |
| 2017/0229287 A1 | 8/2017 | Xu et al. | |
| 2017/0229289 A1* | 8/2017 | Lubomirsky | H01J 37/32357 |
| 2017/0229291 A1 | 8/2017 | Singh et al. | |
| 2017/0229293 A1 | 8/2017 | Park et al. | |
| 2017/0229326 A1 | 8/2017 | Tran et al. | |
| 2017/0229328 A1 | 8/2017 | Benjaminson et al. | |
| 2017/0229329 A1 | 8/2017 | Benjaminson et al. | |
| 2017/0236691 A1 | 8/2017 | Liang et al. | |
| 2017/0236694 A1 | 8/2017 | Eason et al. | |
| 2017/0309509 A1 | 10/2017 | Tran et al. | |
| 2017/0338133 A1 | 11/2017 | Tan et al. | |
| 2017/0338134 A1 | 11/2017 | Tan et al. | |
| 2018/0005850 A1 | 1/2018 | Citla et al. | |
| 2018/0025900 A1* | 1/2018 | Park | H01L 21/02057 |
| 2018/0076031 A1* | 3/2018 | Yan | H01L 21/02664 |
| 2018/0076044 A1 | 3/2018 | Choi et al. | |
| 2018/0076083 A1 | 3/2018 | Ko et al. | |
| 2018/0082861 A1 | 3/2018 | Citla et al. | |
| 2018/0096818 A1 | 4/2018 | Lubomirsky | |
| 2018/0096819 A1 | 4/2018 | Lubomirsky et al. | |
| 2018/0096821 A1 | 4/2018 | Lubomirsky et al. | |
| 2018/0096865 A1 | 4/2018 | Lubomirsky et al. | |
| 2018/0102255 A1* | 4/2018 | Chen | H01L 21/0217 |
| 2018/0102256 A1* | 4/2018 | Chen | H01L 21/0217 |
| 2018/0102259 A1 | 4/2018 | Wang et al. | |
| 2018/0138049 A1 | 5/2018 | Ko et al. | |

(56) References Cited

U.S. PATENT DOCUMENTS

| | | | |
|---|---|---|---|
| 2018/0138055 A1 | 5/2018 | Xu et al. | |
| 2018/0138075 A1 | 5/2018 | Kang et al. | |
| 2018/0138085 A1 | 5/2018 | Wang et al. | |

FOREIGN PATENT DOCUMENTS

| | | | |
|---|---|---|---|
| CN | 101236893 A | 8/2008 | |
| CN | 101378850 A | 3/2009 | |
| EP | 1675160 A1 | 6/2006 | |
| JP | S59-126778 A | 7/1984 | |
| JP | 63301051 A | 12/1988 | |
| JP | H01-200627 A | 8/1989 | |
| JP | H02-114525 A | 4/1990 | |
| JP | H07-153739 A | 6/1995 | |
| JP | H8-31755 A | 2/1996 | |
| JP | H08-107101 A | 4/1996 | |
| JP | H08-264510 A | 10/1996 | |
| JP | H09-260356 A | 10/1997 | |
| JP | 2001-313282 A | 11/2001 | |
| JP | 2001-332608 A | 11/2001 | |
| JP | 2002-075972 A | 3/2002 | |
| JP | 2002-083869 A | 3/2002 | |
| JP | 2003-174020 A | 6/2003 | |
| JP | 2003-282591 A | 10/2003 | |
| JP | 2004-508709 A | 3/2004 | |
| JP | 2004-296467 A | 10/2004 | |
| JP | 2005-050908 A | 2/2005 | |
| JP | 2006-041039 A | 2/2006 | |
| JP | 2006-066408 A | 3/2006 | |
| JP | 2008-288560 A | 11/2008 | |
| JP | 4191137 B2 | 12/2008 | |
| JP | 2009-141343 A | 6/2009 | |
| JP | 2009-530871 A | 8/2009 | |
| JP | 2009-239056 A | 10/2009 | |
| JP | 2010-180458 | 8/2010 | |
| JP | 2011-508436 A | 3/2011 | |
| JP | 2011-518408 A | 6/2011 | |
| JP | 4763293 B2 | 8/2011 | |
| JP | 2011-171378 A | 9/2011 | |
| JP | 2012-19164 A | 1/2012 | |
| JP | 2012-019194 A | 1/2012 | |
| JP | 2012-512531 A | 5/2012 | |
| JP | 2013-243418 A | 12/2013 | |
| JP | 5802323 B2 | 10/2015 | |
| JP | 2016-111177 A | 6/2016 | |
| KR | 10-2000-008278 A | 2/2000 | |
| KR | 10-2000-0064946 A | 11/2000 | |
| KR | 2003-0023964 A | 3/2003 | |
| KR | 10-2003-0054726 A | 7/2003 | |
| KR | 100441297 B1 | 7/2004 | |
| KR | 10-2005-0007143 A | 1/2005 | |
| KR | 10-2005-0042701 A | 5/2005 | |
| KR | 2005-0049903 A | 5/2005 | |
| KR | 10-2006-0080509 A | 7/2006 | |
| KR | 1006-41762 B1 | 11/2006 | |
| KR | 10-2006-0127173 A | 12/2006 | |
| KR | 100678696 B1 | 1/2007 | |
| KR | 100712727 B1 | 4/2007 | |
| KR | 2007-0079870 A | 8/2007 | |
| KR | 10-2008-0063988 A | 7/2008 | |
| KR | 10-0843236 B1 | 7/2008 | |
| KR | 10-2009-0040869 A | 4/2009 | |
| KR | 10-2009-0128913 A | 12/2009 | |
| KR | 10-2010-0013980 A | 2/2010 | |
| KR | 10-2010-0093358 A | 8/2010 | |
| KR | 10-2011-0086540 A | 7/2011 | |
| KR | 10-2011-0114538 A | 10/2011 | |
| KR | 10-2011-0126675 A | 11/2011 | |
| KR | 10-2012-0022251 A | 3/2012 | |
| KR | 10-2012-0082640 A | 7/2012 | |
| KR | 10-2016-0002543 A | 1/2016 | |
| TW | 200709256 A | 3/2007 | |
| TW | 2007-35196 A | 9/2007 | |
| TW | 2011-27983 A1 | 8/2011 | |
| TW | 2012-07919 | 2/2012 | |
| TW | 2012-13594 A | 4/2012 | |
| TW | 2012-33842 A1 | 8/2012 | |
| WO | 2008-112673 A2 | 9/2008 | |
| WO | 2009-084194 A1 | 7/2009 | |
| WO | 2010-010706 | 1/2010 | |
| WO | 2010-113946 A1 | 10/2010 | |
| WO | 2011-027515 A | 3/2011 | |
| WO | 2011-031556 A | 3/2011 | |
| WO | 2011070945 A1 | 6/2011 | |
| WO | 2011-095846 A1 | 8/2011 | |
| WO | 2011-149638 A | 12/2011 | |
| WO | 2012-050321 A | 4/2012 | |
| WO | 2012-118987 A1 | 9/2012 | |
| WO | 2012-125656 A2 | 9/2012 | |
| WO | 2013-118260 A1 | 8/2013 | |

OTHER PUBLICATIONS

Manual No. TQMA72E1. "Bayard-Alpert Pirani Gauge FRG-730: Short Operating Instructions" Mar. 2012. Agilent Technologies, Lexington, MA 02421, USA. pp. 1-45.
International Search Report and Written Opinion of PCT/US2016/045551 dated Nov. 17, 2016, all pages.
International Search Report and Written Opinion of PCT/US2016/045543 dated Nov. 17, 2016, all pages.
"Liang et al. Industrial Application of Plasma Process vol. 3, pp. 61-74, 2010".
Instrument Manual: Vacuum Gauge Model MM200, Rev D. TELEVAC (website: www.televac.com), a Division of the Fredericks Company, Huntingdon Valley, PA, US. 2008. pp. 162.
J.J. Wang and et al., "Inductively coupled plasma etching of bulk 1-20 6H-SiC and thin-film SiCN in NF3 chemistries," Journal of Vacuum Science & Technology A: Vacuum, Surfaces, and Films 16, 2204 (1998).
Won et al. Derwent 2006-065772; Sep. 7, 2014, 10 pages.
International Search Report and Written Opinion of PCT/US2017/060696 dated Jan. 25, 2018, all pages.
International Search Report and Written Opinion of PCT/US2017/055431 dated Jan. 19, 2018, all pages.
International Search Report and Written Opinion of PCT/US2017/047209 dated Nov. 24, 2017, all pages.
International Search Report and Written Opinion of PCT/US2017/033362 dated Aug. 24, 2017, all pages.
International Search Report and Written Opinion of PCT/US2018/016261 dated May 21, 2018, all pages.
International Search Report and Written Opinion of PCT/US2018/016648 dated May 18, 2018, all pages.

\* cited by examiner

SILICON PRETREATMENT FOR NITRIDE REMOVAL

TECHNICAL FIELD

The present technology relates to semiconductor processes and equipment. More specifically, the present technology relates to treating exposed materials prior to etching operations.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. A wet HF etch preferentially removes silicon oxide over other dielectrics and materials. However, wet processes may have difficulty penetrating some constrained trenches and also may sometimes deform the remaining material. Dry etches produced in local plasmas formed within the substrate processing region can penetrate more constrained trenches and exhibit less deformation of delicate remaining structures. However, local plasmas may damage the substrate through the production of electric arcs as they discharge.

Thus, there is a need for improved systems and methods that can be used to produce high quality devices and structures. These and other needs are addressed by the present technology.

SUMMARY

Exemplary methods for treating a silicon-containing substrate may include flowing a hydrogen-containing precursor into a remote plasma region of a semiconductor processing chamber. The methods may include forming a plasma within the remote plasma region to generate plasma effluents of the hydrogen-containing precursor. The methods may include flowing the plasma effluents into a processing region of the semiconductor processing chamber. A silicon-containing substrate may be positioned within the processing region and include a trench formed through stacked layers including alternating layers of silicon nitride and silicon oxide exposing a portion of the silicon-containing substrate. The methods may include contacting the exposed portion of the silicon-containing substrate with the plasma effluents. The methods may include flowing an oxygen-containing precursor into the processing region of the semiconductor processing chamber. The methods may include contacting the exposed portion of the silicon-containing substrate with the oxygen-containing precursor. The methods may also include converting the exposed portion of the silicon-containing substrate to silicon oxide.

In embodiments the method may further include laterally etching the layers of silicon nitride from sidewalls of the trench subsequent the converting. The etching may at least partially remove the converted silicon oxide. The methods may also include repeating the method for at least one additional cycle. The silicon-containing substrate may be etched less than 5 nm during the method. The exposed portion of the silicon-containing substrate converted to silicon oxide may be characterized by a thickness of silicon oxide less than or about 5 nm. The exposed portion of the silicon-containing substrate converted to silicon oxide may be formed beneath a layer of native oxide formed on the silicon-containing substrate. The method may be performed at a chamber operating pressure of less than or about 10 Torr. The method may be performed at a chamber temperature greater than or about 100° C. The oxygen-containing precursor may be water vapor. The water vapor may be flowed into the processing region without plasma enhancement. The hydrogen-containing precursor may be hydrogen.

The present technology also encompasses additional methods of treating a substrate. The methods may include forming a plasma within a remote plasma region of a semiconductor processing chamber containing a hydrogen-containing precursor to generate plasma effluents of the hydrogen-containing precursor. The methods may include flowing the plasma effluents into a processing region of the semiconductor processing chamber. A substrate may be positioned within the processing region, and the substrate may include a trench formed through stacked layers including alternating layers of silicon nitride and silicon oxide exposing a portion of the substrate. The methods may include contacting the exposed portion of the substrate with the plasma effluents. The methods may include flowing water vapor into the processing region of the semiconductor processing chamber. The methods may include contacting the exposed portion of the substrate with the water vapor. The methods may also include forming a layer of oxide on the exposed portion of the substrate.

In some embodiments the methods may also include laterally etching the layers of silicon nitride from sidewalls of the trench subsequent forming the layer of oxide. The etching may at least partially remove the layer of oxide. The methods may also include repeating the method. Repeating flowing the plasma effluents into the processing region of the semiconductor processing chamber may include contacting exposed surfaces of the layers of silicon oxide with the plasma effluents. The plasma effluents may remove fluorine from the layers of silicon oxide. The water vapor may be flowed into the processing region without plasma enhancement. The method may be performed at a chamber temperature greater than or about 200° C.

Such technology may provide numerous benefits over conventional systems and techniques. For example, the processes may protect substrates from undercut. Additionally, the operations of embodiments of the present technology may increase selectivity of subsequently performed etching operations. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
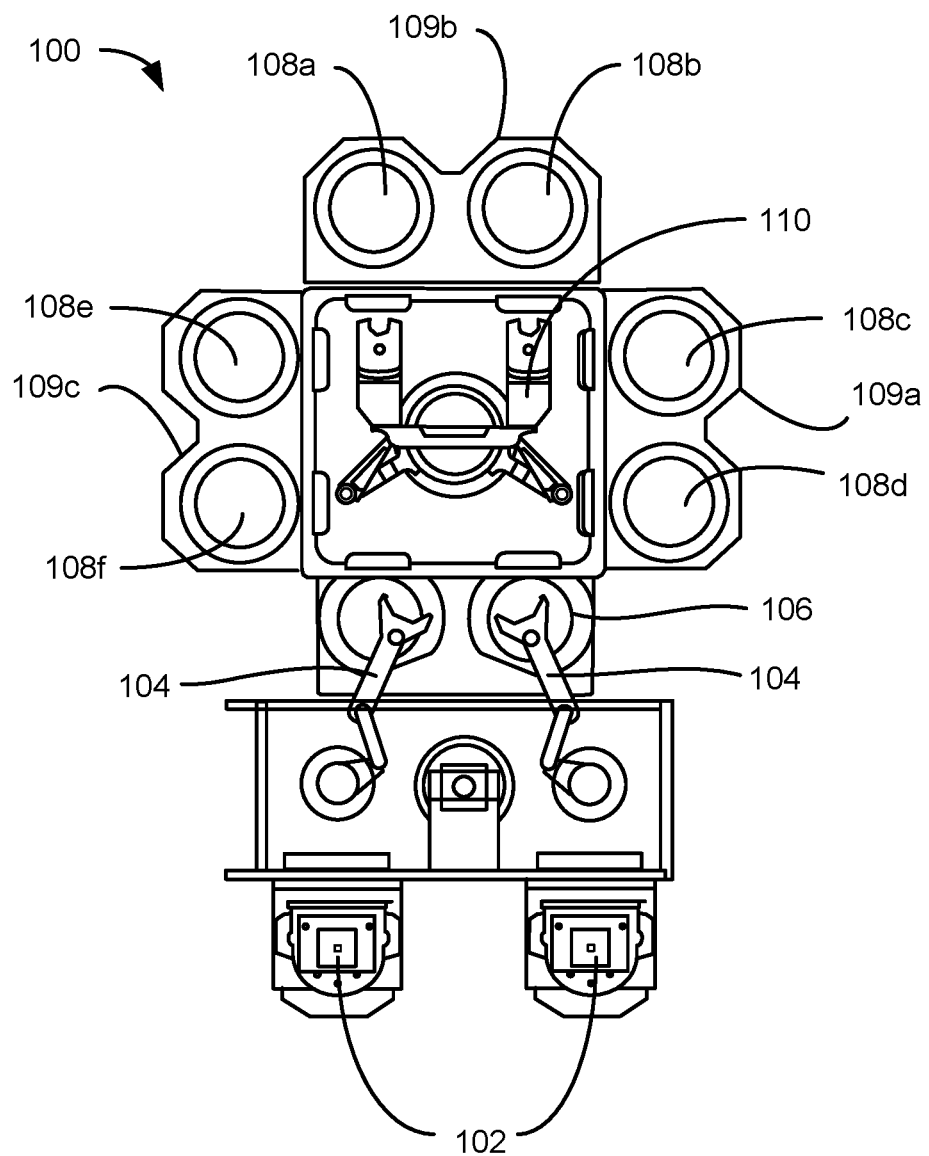
FIG. 1 shows a top plan view of one embodiment of an exemplary processing system according to embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include superfluous or exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

In transitioning from 2D NAND to 3D NAND, many process operations are modified from vertical to horizontal operations. Additionally, as 3D NAND structures grow in the number of cells being formed, the aspect ratios of memory holes and other structures increase, sometimes dramatically. During 3D NAND processing, stacks of placeholder layers and dielectric materials may form the interelectrode dielectric or IPD layers. These placeholder layers may have a variety of operations performed to place structures before fully removing the material and replacing it with metal. While the metallization may be incorporated on one side of the cell structure, operations may have previously been performed on the other side of the structure, such as forming floating gates or charge-trap layers. Although these layers may be formed within the memory hole, crosstalk between vertically separated memory cells may occur. One way to reduce this communication may include etching the placeholder material before forming these layers to allow dielectric material to further separate the individual cell material layers from adjacent cells.

Many conventional technologies utilize a wet etch to access each of the cell placeholder materials to perform a lateral etch of placeholders before forming layers, such as the charge-trap layer. However, wet etching may be more robust than other etching techniques, and the wet etching may etch the placeholder materials further than necessary or desired. For example, the wet etching may over etch some features. Additionally, wet etching of small form factor structures may cause pattern collapse or deformation due to surface tension of the etchant. Using wet etchants may also create the need for subsequent operations to remove residues formed within the trenches or holes. Dry etching techniques may also be performed, however many of the dry etchants utilized additionally etch silicon and silicon oxide reducing selectivity of the process. Exposed portions of an underlying silicon substrate may be exposed to the etchants, and due to the relatively weak bonding of silicon, the etchants may etch through the substrate as well.

The present technology overcomes these issues by performing a dry etch process after a protective layer is formed on the exposed portion of the substrate. The protective layer may be formed to limit an effect on the exposed silicon nitride and silicon oxide layer. In this way, the protective material may allow etching operations to be performed that may not remove or may only minimally remove underlying substrate materials.

Although the remaining disclosure will routinely identify specific etching processes utilizing the disclosed technology, it will be readily understood that the systems and methods are equally applicable to deposition and cleaning processes as may occur in the described chambers. Accordingly, the technology should not be considered to be so limited as for use with etching processes or chambers alone. Moreover, although an exemplary chamber is described to provide foundation for the present technology, it is to be understood that the present technology can be applied to virtually any semiconductor processing chamber that may allow the single-chamber operations described.

FIG. 1 shows a top plan view of one embodiment of a processing system 100 of deposition, etching, baking, and curing chambers according to embodiments. In the figure, a pair of front opening unified pods (FOUPs) 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The substrate processing chambers 108a-f may include one or more system components for depositing, annealing, curing and/or etching a dielectric film on the substrate wafer. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to etch a dielectric film on the substrate. Any one or more of the processes described may be carried out in chamber(s) separated from the fabrication system shown in different embodiments. It will be appreciated that additional configurations of deposition, etching, annealing, and curing chambers for dielectric films are contemplated by system 100.

Figure 2A:
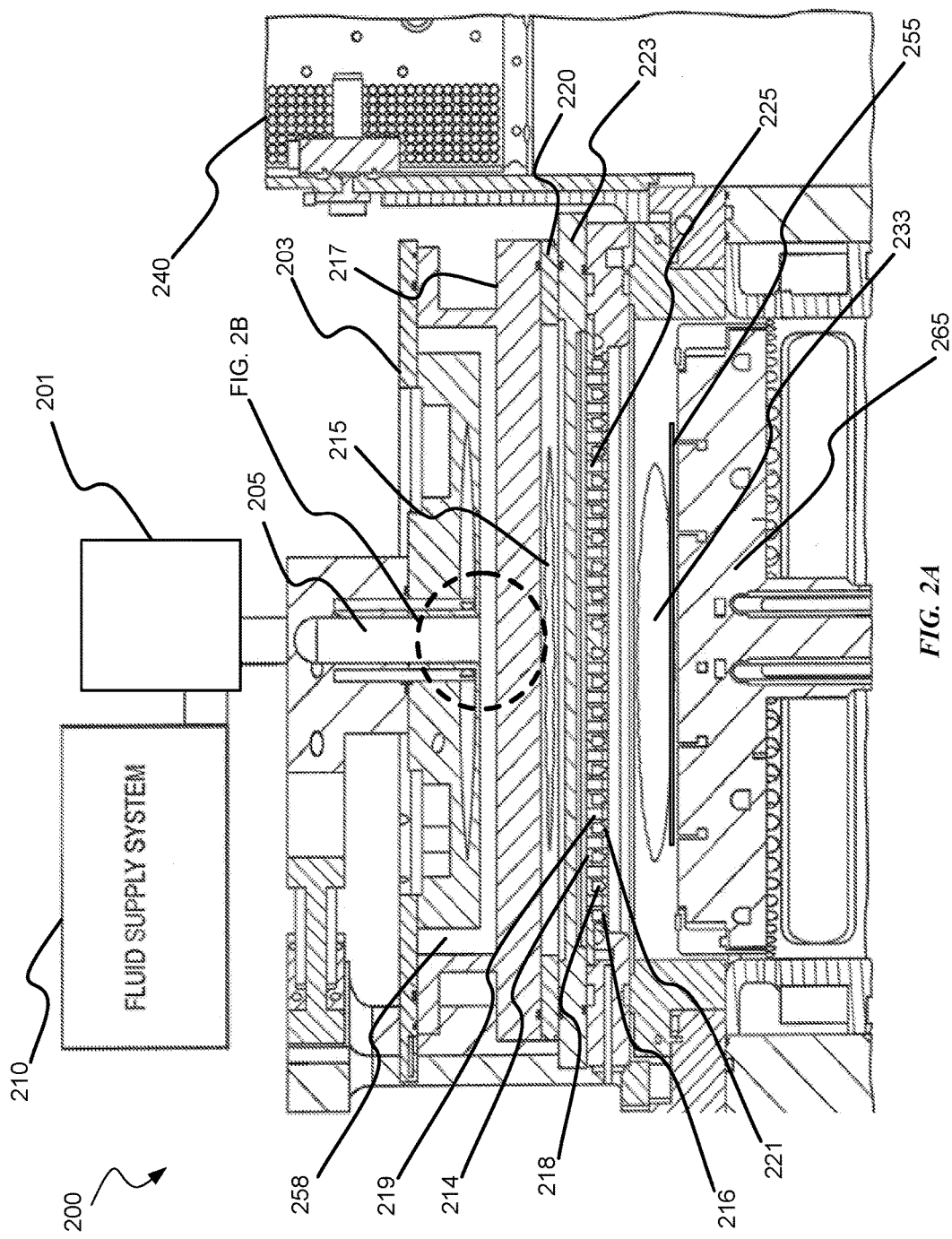
FIG. 2A shows a schematic cross-sectional view of an exemplary processing chamber according to embodiments of the present technology.

FIG. 2A shows a cross-sectional view of an exemplary process chamber system 200 with partitioned plasma generation regions within the processing chamber. During film etching, e.g., titanium nitride, tantalum nitride, tungsten, silicon, polysilicon, silicon oxide, silicon nitride, silicon oxynitride, silicon oxycarbide, etc., a process gas may be flowed into the first plasma region 215 through a gas inlet assembly 205. A remote plasma system (RPS) 201 may optionally be included in the system, and may process a first gas which then travels through gas inlet assembly 205. The inlet assembly 205 may include two or more distinct gas supply channels where the second channel (not shown) may bypass the RPS 201, if included.

A cooling plate 203, faceplate 217, ion suppressor 223, showerhead 225, and a substrate support 265, having a substrate 255 disposed thereon, are shown and may each be included according to embodiments. The pedestal 265 may have a heat exchange channel through which a heat exchange fluid flows to control the temperature of the substrate, which may be operated to heat and/or cool the substrate or wafer during processing operations. The wafer support platter of the pedestal 265, which may comprise aluminum, ceramic, or a combination thereof, may also be resistively heated in order to achieve relatively high temperatures, such as from up to or about 100° C. to above or about 1100° C., using an embedded resistive heater element.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the RPS 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215.

Structural and operational features may be selected to prevent significant backflow of plasma from the first plasma region 215 back into the supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively coupled plasma (CCP) to be formed in the first plasma region. A baffle (not shown) may additionally be located in the first plasma region 215, or otherwise coupled with gas inlet assembly 205, to affect the flow of fluid into the region through gas inlet assembly 205.

The ion suppressor 223 may comprise a plate or other geometry that defines a plurality of apertures throughout the structure that are configured to suppress the migration of ionically-charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity, e.g., SiNx:SiOx etch ratios, Si:SiOx etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the plasma excitation region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225. Plasma may be present in chamber plasma region 215 to produce the radical precursors from an inflow of, for example, a fluorine-containing precursor or other precursor. An AC voltage typically in the radio frequency (RF) range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

Figure 2B:
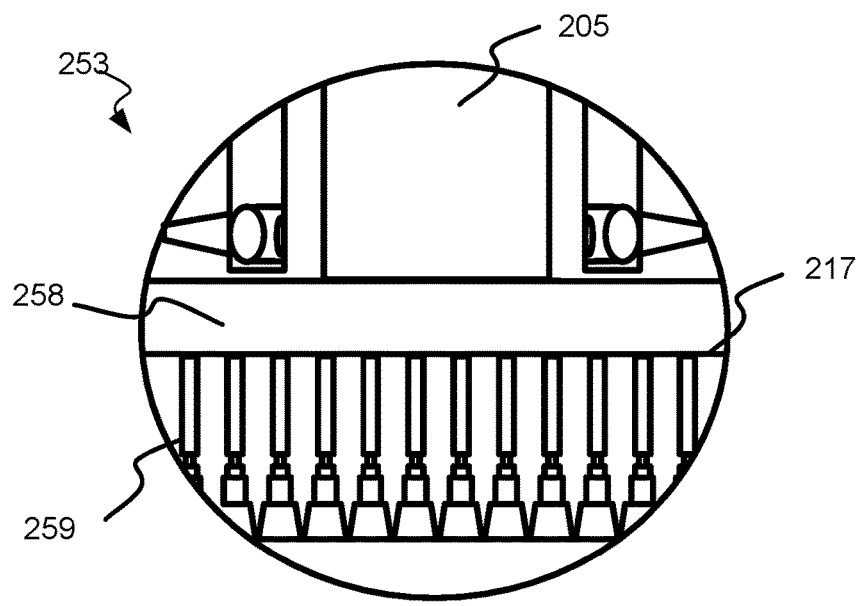
FIG. 2B shows a detailed view of a portion of the processing chamber illustrated in FIG. 2A according to embodiments of the present technology.

FIG. 2B shows a detailed view 253 of the features affecting the processing gas distribution through faceplate 217. As shown in FIGS. 2A and 2B, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233, but may be partially or fully prevented from backflow into the gas supply region 258 after traversing the faceplate 217.

Figure 3:
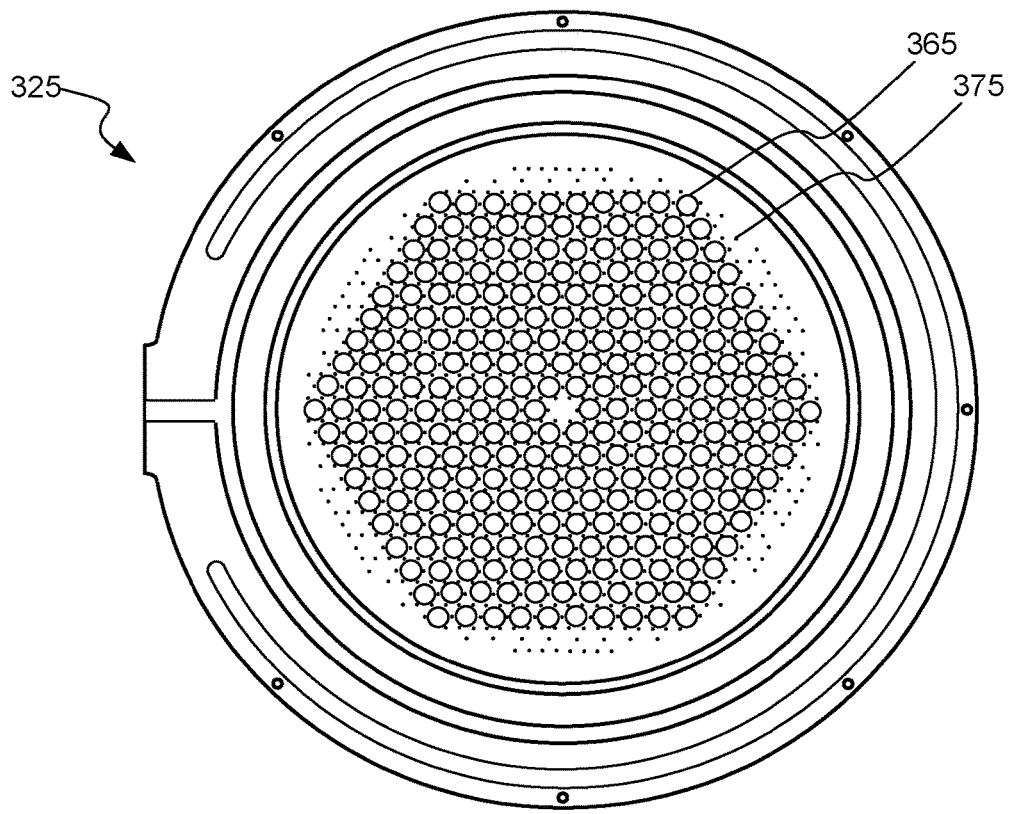
FIG. 3 shows a bottom plan view of an exemplary showerhead according to embodiments of the present technology.

The gas distribution assemblies such as showerhead 225 for use in the processing chamber section 200 may be referred to as dual channel showerheads (DCSH) and are additionally detailed in the embodiments described in FIG. 3. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first fluid channels 219 through the upper and lower plates, and second fluid channels 221 through the lower plate 216. The formed channels may be configured to provide fluid access from the volume 218 through the lower plate 216 via second fluid channels 221 alone, and the first fluid channels 219 may be fluidly isolated from the volume 218 between the plates and the second fluid channels 221. The volume 218 may be fluidly accessible through a side of the gas distribution assembly 225.

FIG. 3 is a bottom view of a showerhead 325 for use with a processing chamber according to embodiments. Showerhead 325 may correspond with the showerhead 225 shown in FIG. 2A. Through-holes 365, which show a view of first fluid channels 219, may have a plurality of shapes and configurations in order to control and affect the flow of precursors through the showerhead 225. Small holes 375, which show a view of second fluid channels 221, may be distributed substantially evenly over the surface of the showerhead, even amongst the through-holes 365, and may help to provide more even mixing of the precursors as they exit the showerhead than other configurations.

Figure 4:
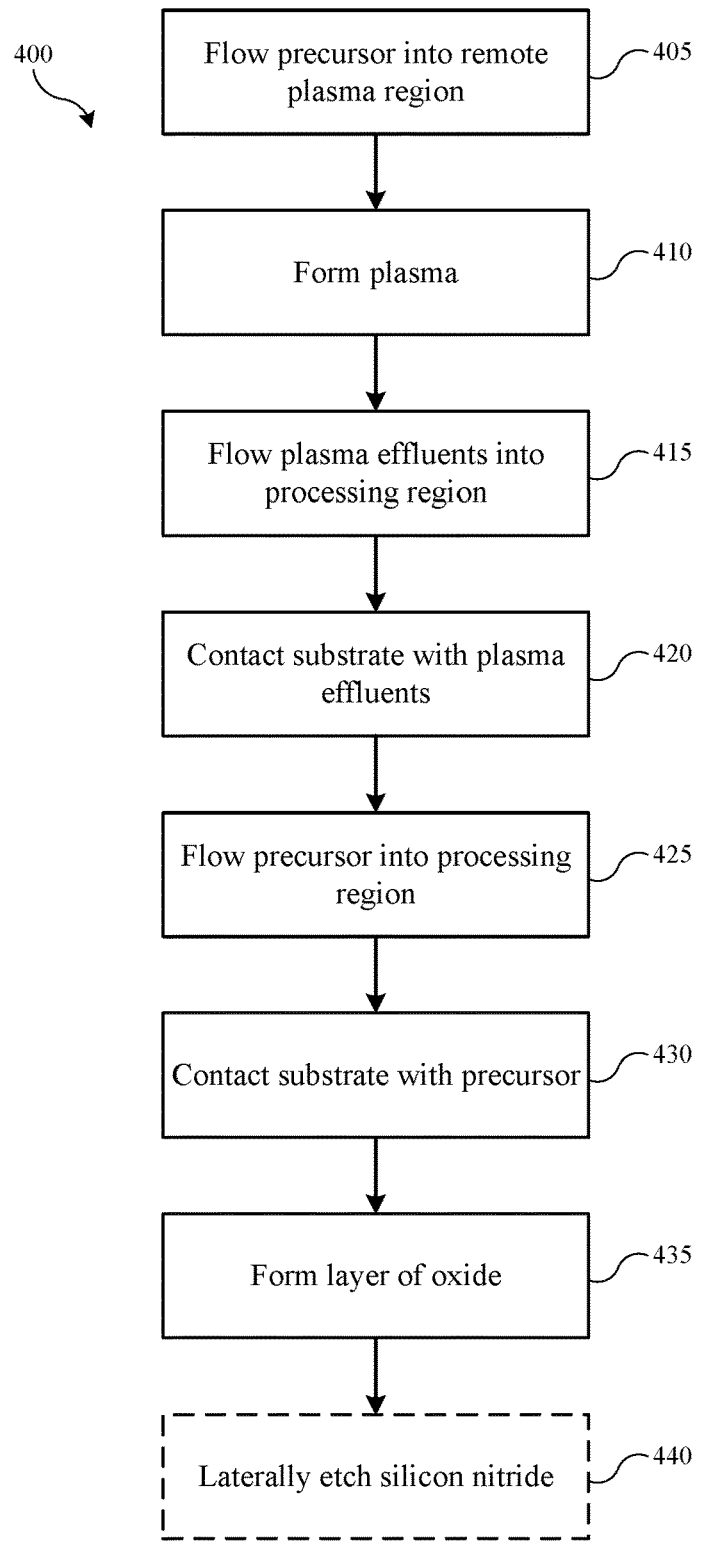
FIG. 4 shows exemplary operations in a method according to embodiments of the present technology.

The chambers discussed previously may be used in performing exemplary methods including etching methods and treatment methods. Turning to FIG. 4 is shown exemplary operations in a method 400 according to embodiments of the present technology. Prior to the first operation of the method a substrate may be processed in one or more ways before being placed within a processing region of a chamber in which method 400 may be performed. For example, IPD layers may be formed on the substrate and then one or more memory holes or trenches may be formed through the stacked layers. The IPD layers may include any number of materials, and may include alternating layers of a placeholder material and a dielectric material.

In embodiments the dielectric material may be or include silicon oxide, and the placeholder material may be or include silicon nitride. Although the remaining disclosure will discuss silicon nitride and silicon oxide, any other known materials used in these two layers may be substituted for one or more of the layers. Some or all of these operations may be performed in chambers or system tools as previously described, or may be performed in different chambers on the same system tool, which may include the chamber in which the operations of method 400 are performed.

The method 400 may include flowing a hydrogen-containing precursor into a remote plasma region of a semiconductor processing chamber at operation 405. An exemplary chamber may be chamber 200 previously described, which may include one or both of the RPS unit 201 or first plasma region 215. Either or both of these regions may be the remote plasma region used in operation 405. A plasma may be generated within the remote plasma region at operation 410, which may generate plasma effluents of the hydrogen-containing precursor. The plasma effluents may be flowed to a processing region of the chamber at operation 415. The plasma effluents may interact with the substrate in the processing region at operation 420. As noted, the substrate may include a silicon or silicon-containing substrate or wafer on which a number of layers of material have been formed, such as alternating layers of silicon oxide and silicon nitride. A memory hole or trench may be formed through the stacked layers that extends to the level of the substrate, which may provide an exposed portion of the substrate at the bottom of the hole or trench. In this way, within the hole structure, there may be exposed regions of silicon nitride, silicon oxide, and silicon or some silicon-containing material.

The formation of the hole or trench may have occurred in a different chamber, or at some previous operational step. If performed within the same chamber as method 400, the exposed portion of the surface of the substrate may be relatively clean or neat. However, if the process was performed in a different chamber, or in a different environment, there may be a native oxide formed over the exposed portion of the substrate through the hole or trench. The native oxide may be different from the oxide formed in the alternating layers of the memory structure. For example, while the layers of silicon oxide that may be used to divide memory cells may be a relatively higher quality oxide, native oxide may be a relatively low quality oxide, and may be relatively porous compared to the layers of silicon oxide.

The etching process to remove silicon nitride may have relatively high selectivity to silicon oxide, such as selectivities greater than or about 100:1 or more. However, in some structures, the amount of silicon nitride to be removed may be several nanometers up to a fraction of a micrometer or more. For example, in some embodiments the amount of silicon nitride to be recessed may be tens of nanometers up to hundreds of nanometers. Such an amount of material to be etched may occur over a relatively longer etching time period. The selectivity to oxide of the nitride removal process may operate in part based on an oxide resistance to the etchant, which may include a fluorine-containing material. Fluorine may eventually permeate portions of the silicon oxide materials as well, creating volatile materials that will remove the silicon oxide material as well. However, this process generally includes an incubation period in which the fluorine slowly interacts with the oxide material. The incubation may occur over 2 minutes or more, such as up to 5 minutes, up to 10 minutes, or more depending on the quality of the oxide, the energy of the fluorine, and other processing conditions.

Native oxide, however, may be removed much more quickly due to the porous structure, which may fully expose silicon in the substrate underneath. Because of the process used to remove silicon nitride, the etching process may not be characterized by as high an etch rate relative to silicon, and the exposed silicon may etch in the process. This may cause surface roughness, pitting, as well as etching that may undercut the memory structures, depending on the time the etching process is performed. Accordingly, to protect the underlying silicon, the present technology may form a protective layer of oxide that is of a higher quality than native oxide. However, as the layers of silicon nitride are similarly exposed to the treatment, the treatment may be performed to selectively form oxide on the silicon, while limiting any effect on the exposed regions of silicon oxide and silicon nitride within the trench or hole.

The radical hydrogen effluents may contact the semiconductor structure and permeate the formed trench. The exposed surfaces of silicon oxide and silicon nitride may not be affected, or may be minimally affected by the hydrogen plasma effluents, as the silicon oxide and silicon nitride may have stronger bonding. As the effluents extend through the memory structure, they may contact the exposed portion of the substrate, which may include silicon, and the effluents may have sufficient energy to interact with the relatively weaker bonding of the silicon.

Additionally, in embodiments in which there is an overlying native oxide, the porosity of the native oxide may allow the hydrogen radicals to penetrate the native oxide as well. As the hydrogen radicals penetrate the oxide and interact with the silicon, the hydrogen may hydrogenate the silicon structure, and may also damage the silicon bonding. This may produce dangling bonds that may include dangling Si—H bonds as well as dangling silicon bonds.

The extent of this damage or interaction may be related to the power of the plasma used to form the hydrogen-containing plasma effluents, as well as the distance to be travelled by the formed effluents. For example, by utilizing a remote plasma, a relatively lower plasma power may be used, such as below 5 kW, below or about 1 kW, below or about 500 Watts, or less, which may limit the energy of the plasma effluents. This may also limit the extent to which the plasma effluents interact with the silicon nitride structure, as a local plasma may retain sufficient energy at the wafer level to at least damage upper layers of the silicon nitride contained in the stack. However, this power level when used in remote plasma may be sufficient to interact with the silicon, and may affect the silicon structure to a depth of greater than or about 5 Å, greater than or about 1 nm, greater than or about 1.5 nm, greater than or about 2 nm, greater than or about 2.5 nm, greater than or about 3 nm, greater than or about 3.5 nm, greater than or about 4 nm, greater than or about 4.5 nm, greater than or about 5 nm, or greater, although at this level the energy may be sufficient to affect the silicon nitride. Accordingly, the energy may be sufficient to affect up to 3 nm within the silicon, which may limit interaction with silicon nitride.

Subsequent the plasma effluent interaction with the substrate, method 400 may continue by flowing an oxygen-containing precursor into the processing chamber at operation 425. The oxygen-containing precursor, which may be or include water vapor, may not be passed through a remote plasma prior to being delivered to the substrate processing region, or the plasma may not be engaged through these regions while the oxygen-containing precursor is being delivered. Because the precursor may not have any plasma enhancement, the precursor may not interact with the silicon nitride or silicon oxide layers of the memory stack when the precursor contacts the substrate at operation 430. However, the precursor may penetrate the native oxide, and seek out the dangling bonds. The oxygen-containing precursor may interact with the dangling bonds to provide oxygen forming an oxide layer at operation 435. This process may also be termed a conversion process as the oxide may not be necessarily deposited in some embodiments of the present technology and instead a portion of the silicon substrate may be converted to silicon oxide. Regardless, the present technology encompasses any type of formation of the oxide layer on the substrate, including below a native oxide layer. Once the oxide layer has been formed, a selective etching process may be performed to etch the silicon nitride at optional operation 440.

The hydrogen-containing precursor may be or include hydrogen, a hydrocarbon, or any hydrogen-containing precursor. Example oxygen-containing precursors may be or include water vapor, hydrogen peroxide, oxygen, ozone, or an energized oxygen-containing material, although as previously explained in some embodiments the oxygen-containing precursor may not be plasma enhanced to limit interaction with the silicon nitride materials through the trench that are to be later etched.

Precursors used in the optional silicon nitride etching operation 440 may include a fluorine-containing precursor as well as an oxygen-containing precursor. An exemplary fluorine-containing precursor may be nitrogen trifluoride ($NF_3$), which may be flowed into the remote plasma region, which may be separate from, but fluidly coupled with, the processing region. Other sources of fluorine may be used in conjunction with or as replacements for the nitrogen trifluoride. In general, a fluorine-containing precursor may be flowed into the remote plasma region and the fluorine-containing precursor may include at least one precursor selected from the group of atomic fluorine, diatomic fluorine, nitrogen trifluoride, carbon tetrafluoride, hydrogen fluoride, xenon difluoride, and various other fluorine-containing precursors used or useful in semiconductor processing. The oxygen-containing precursor may include a variety of fluids, and may include one or more of atomic oxygen, molecular oxygen, $N_2O$, NO, $NO_2$, ozone, or other oxygen-containing precursors that may be used or useful in semiconductor processes. The precursors may also include any number of carrier gases, which may include nitrogen, helium, argon, or other noble, inert, or useful precursors. The carrier gases may be used to dilute the precursors, which may further reduce etching rates to allow adequate diffusion through the trench.

Process conditions may also impact the operations performed in method 400. Each of the operations of method 400 may be performed during a constant temperature in embodiments, while in some embodiments the temperature may be adjusted during different operations, such as after the pretreatment has been performed. For example, a first temperature may be used during the operations of forming the oxide layer, and then the chamber may be adjusted to a second temperature below the first temperature to perform the optional silicon nitride etch process. For example, the substrate, pedestal, or chamber temperature during the oxide formation may be maintained at a temperature greater than or about 100° C., and in some embodiments the temperature may be maintained greater than or about 150° C., greater than or about 200° C., greater than or about 250° C., greater than or about 300° C., greater than or about 350° C., or greater than or about 400° C. Maintaining the processing, chamber, or substrate temperatures at higher relative temperatures may facilitate the interaction of both the hydrogen plasma effluents as well as the water vapor or oxygen-containing precursor.

In some embodiments, subsequent formation of the oxide layer, the temperature within the processing chamber may be reduced to below or about 100° C. for the optional etch of silicon nitride at operation 440. The temperature may also be maintained below or about 80° C., below or about 60° C., below or about 40° C., below or about 20° C., below or about 0° C., below or about −20° C., below or about −40° C., or lower. Temperature may affect the etching process itself, and higher temperature may produce higher etch rates, increased etching, or other effects. Similarly, lower temperatures may slow the etching operation and allow an oxidation of portions of silicon nitride prior to the etching, or while minimal etching has occurred. Thus, in some embodiments, maintaining a temperature below or about 0° C. may provide more uniform etching amounts of silicon nitride at the top of the trench and at the bottom of the trench. As temperature increases, the etching operations may additionally begin to affect the dielectric regions, and may cause slight rounding of exposed corners or regions of the dielectric material, such as silicon oxide.

The pressure within the chamber may also affect the operations performed, and in embodiments the chamber pressure may be maintained below about 10 Torr, below about 5 Torr, or below about 1 Torr. In embodiments a pressure below or about 1 Torr may allow the precursors or plasma effluents to more easily flow into the trenches or memory holes. However, when the pressure is reduced below about 0.5 Torr, a remote plasma may be affected, and may have reduced stability or may become unstable. As mentioned previously, the remote plasma may include an RPS unit, and may also be a region or portion of the chamber physically partitioned from the processing region of the chamber to limit or eliminate plasma at the wafer level. In some embodiments in which an RPS unit is utilized, a choke may be utilized to maintain a higher pressure within the RPS unit for plasma stability with a lower pressure within a chamber for improved in-trench flow of precursors or plasma effluents. Accordingly, a turbomolecular pump may be utilized in the chamber allowing a chamber pressure down to a few milliTorr, while the RPS is maintained above or about 0.6 Torr.

As noted above, the lateral etch may include oxidizing a portion of the silicon nitride layers adjacent the trench, and may involve forming a fluorinated oxide. The fluorine within or proximate the fluorinated oxide may diffuse through the layer or oxidized portion during the operation to laterally etch the silicon nitride or the oxidized portion of the silicon nitride. Because of the mechanisms of the removal operation, the lateral etch of silicon nitride may impact the oxide layer formed at the bottom of the trench as previously explained, where fluorine utilized in the etch process may erode the formed oxide layer, which may be stronger than native oxide, although may not be as high quality as the layers of silicon oxide, for example. Accordingly, in some embodiments, the lateral etch of silicon nitride may at least partially remove the formed silicon oxide, and may fully remove the formed silicon oxide depending on the amount of nitride removal performed. Accordingly, the present technology may be performed in a number of cycles to refresh the silicon oxide at the bottom of the trench. In some embodiments the process, including the optional lateral etch, may be performed in at least about 2, at least about 3, at least about 4, at least about 5, or more cycles, depending on factors such as the extent of silicon nitride etching to be performed, the rate at which the formed oxide may be removed, or other effects of the process. On completion of the silicon nitride etching, the layer of silicon oxide formed, or layers that get removed through cycling, may limit the degree of etching of the underlying silicon substrate. For example, in embodiments of the present technology, the silicon or silicon-containing substrate may be etched less than or about 5 nm in embodiments, and may be etched less than or about 4 nm, less than or about 3 nm, less than or about 2 nm, less than or about 1 nm, less than or about 5 Å, or less. In some embodiments, aside from the portion of the structure that is converted and/or consumed as silicon oxide in each cycle, the silicon substrate may be substantially or essentially maintained.

A benefit of performing additional cycles may include that the hydrogen plasma effluents may beneficially interact with the silicon oxide layers of the stack to extract fluorine that may be interacting with the layers. As previously discussed, silicon oxide may eventually react to the process for removing silicon nitride after an incubation period in which the fluorine may begin to interact with and extend into the oxide structure. However, although the hydrogen effluents may not react with the silicon oxide itself, or may only minimally interact, the effluent energy may be sufficient to withdraw fluorine that has begun to interact with the silicon oxide, and may remove the fluorine from the layers when the plasma effluents contact the exposed surfaces of the layers of silicon oxide. This may, at least to an extent, refresh the incubation period, and may increase the overall selectivity of the silicon nitride etch process relative to silicon oxide by removing residual etchant from the silicon oxide with each cycle.

Figure 5A:
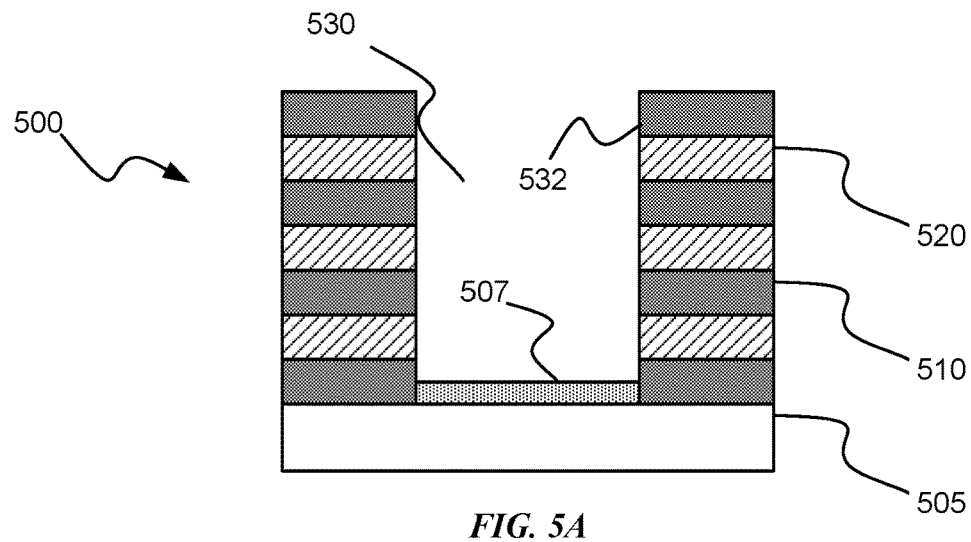
FIGS. 5A-5C show cross-sectional views of substrates being processed according to embodiments of the present technology.
Figure 5B:
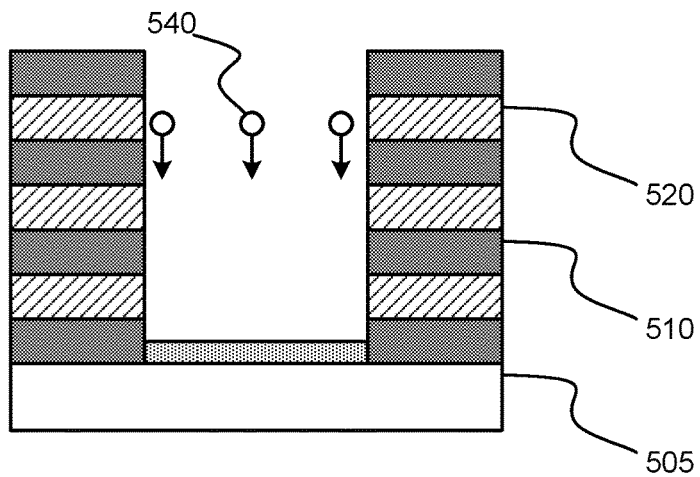
Figure 5C:
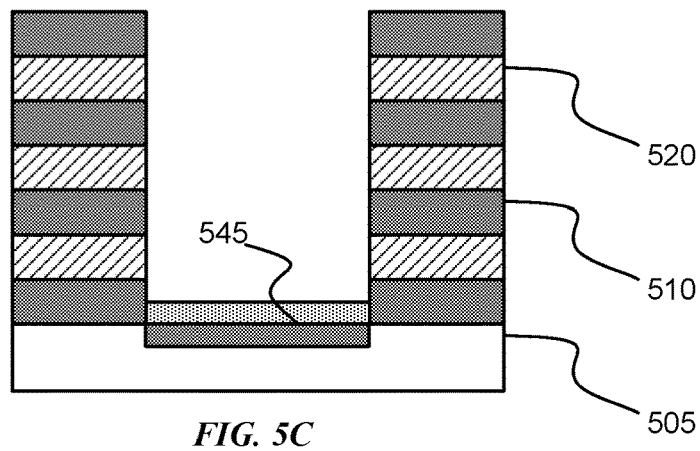

Turning to FIGS. 5A-5C are shown cross-sectional views of structure 500 being processed according to embodiments of the present technology. As illustrated in FIG. 5A substrate 505 may have a plurality of stacked layers overlying the substrate, which may be silicon, silicon germanium, or other substrate materials. The layers may include IPD layers including dielectric material 510, which may be silicon oxide, in alternating layers with placeholder material 520, which may be silicon nitride. Placeholder material 520 may be or include material that will be removed to produce individual memory cells in subsequent operations. Although illustrated with only 7 layers of material, exemplary structures may include any of the numbers of layers previously discussed, and it is to be understood that the figures are only schematics to illustrate aspects of the present technology. Trench 530, which may be a memory hole, may be defined through the stacked structure to the level of substrate 505. Trench 530 may be defined by sidewalls 532 that may be composed of the alternating layers of dielectric material 510 and placeholder material 520. As previously discussed, substrate 505 may have a native oxide 507 formed overlying the exposed portion of the substrate within the trench. Depending on the exposure of the substrate to ambient conditions, native oxide 507 may or may not be present.

In FIG. 5B is illustrated a structure after methods according to the present technology have been performed, such as discussed with respect to FIG. 4 above. A remote plasma of a hydrogen-containing precursor may be formed to produce hydrogen or hydrogen-containing plasma effluents 540. The plasma effluents may be delivered to the substrate processing region, where the effluents may interact with the substrate and exposed materials. The effluents 540 may not interact with the layers 510, 520, although the effluents may pass through native oxide 507 and contact substrate 505. The effluents may have sufficient energy to affect the silicon bonding of the substrate, which may create dangling silicon bonds and dangling silicon-hydrogen bonds. Depending on the energy associated with the plasma effluents 540, the effluents may interact within the structure to a distance of up to, about, or greater than about 1 nm, 2 nm, 3 nm, or more as previously described.

FIG. 5C illustrates a structure after further methods or operations according to the present technology have been performed, such as discussed with respect to FIG. 4 above. An oxygen-containing precursor, such as water vapor, may be delivered to the processing chamber, and the precursor may not include any plasma enhancement prior to being delivered. The precursor may flow into the trench and permeate the native oxide 507 if present. The precursor may interact with the dangling bonds to form a silicon oxide layer 545, which may be a converted portion of the silicon substrate 505. Oxide layer 545 may be characterized as a higher quality oxide than native oxide 507, which may provide protection to the substrate 505 from a subsequent silicon nitride etching process to be performed. In embodiments, substrate 505 may show minimal etching at the bottom of the trench during a subsequent nitride etch, and the substrate may be reduced by an amount less than or about 5 nm, and may be reduced to an amount less than or about 3 nm, less than or about 2 nm, less than or about 1 nm, or may be substantially maintained during the lateral etching operations of silicon nitride. This removal may be or include a portion that is converted over one or more cycles of the process. For example, if the oxide layer 545 converts about 1 nm of the silicon substrate 505, and the entire process including laterally etching silicon nitride is performed for three cycles, an amount of about 3 nm of the silicon substrate may be consumed by the process. However, the substrate may not be characterized by pitting or undercut etching by performing pretreatment operations according to the present technology.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of treating a silicon-containing substrate, the method comprising:
   flowing a hydrogen-containing precursor into a remote plasma region of a semiconductor processing chamber;
   forming a plasma within the remote plasma region to generate plasma effluents of the hydrogen-containing precursor;
   flowing the plasma effluents into a processing region of the semiconductor processing chamber, wherein a silicon-containing substrate is positioned within the processing region, and wherein the silicon-containing substrate comprises a trench formed through stacked layers including alternating layers of silicon nitride and silicon oxide exposing a portion of the silicon-containing substrate;
   contacting the exposed portion of the silicon-containing substrate with the plasma effluents;
   flowing an oxygen-containing precursor into the processing region of the semiconductor processing chamber;
   contacting the exposed portion of the silicon-containing substrate with the oxygen-containing precursor; and
   converting the exposed portion of the silicon-containing substrate to silicon oxide.

2. The method of treating a silicon-containing substrate of claim 1, further comprising laterally etching the layers of silicon nitride from sidewalls of the trench subsequent the converting.

3. The method of treating a silicon-containing substrate of claim 2, wherein the etching at least partially removes the converted silicon oxide.

4. The method of treating a silicon-containing substrate of claim 2, further comprising repeating the method for at least one additional cycle.

5. The method of treating a silicon-containing substrate of claim 4, wherein the silicon-containing substrate is etched less than 5 nm during the method.

6. The method of treating a silicon-containing substrate of claim 1, wherein the exposed portion of the silicon-containing substrate converted to silicon oxide is characterized by a thickness of silicon oxide less than or about 5 nm.

7. The method of treating a silicon-containing substrate of claim 1, wherein the exposed portion of the silicon-containing substrate converted to silicon oxide is beneath a layer of native oxide formed on the silicon-containing substrate.

8. The method of treating a silicon-containing substrate of claim 1, wherein the method is performed at a chamber operating pressure of less than or about 10 Torr.

9. The method of treating a silicon-containing substrate of claim 1, wherein the method is performed at a chamber temperature greater than or about 100° C.

10. The method of treating a silicon-containing substrate of claim 1, wherein the oxygen-containing precursor is water vapor.

11. The method of treating a silicon-containing substrate of claim 10, wherein the water vapor is flowed into the processing region without plasma enhancement.

12. The method of treating a silicon-containing substrate of claim 1, wherein the hydrogen-containing precursor is hydrogen.

13. A method of treating a substrate, the method comprising:
    forming a plasma within a remote plasma region of a semiconductor processing chamber containing a hydrogen-containing precursor to generate plasma effluents of the hydrogen-containing precursor;
    flowing the plasma effluents into a processing region of the semiconductor processing chamber, wherein a substrate is positioned within the processing region, and wherein the substrate comprises a trench formed through stacked layers including alternating layers of silicon nitride and silicon oxide exposing a portion of the substrate;
    contacting the exposed portion of the substrate with the plasma effluents;
    flowing water vapor into the processing region of the semiconductor processing chamber;
    contacting the exposed portion of the substrate with the water vapor; and
    forming a layer of oxide on the exposed portion of the substrate.

14. The method of treating a substrate claim 13, further comprising laterally etching the layers of silicon nitride from sidewalls of the trench subsequent forming the layer of oxide.

15. The method of treating a substrate of claim 14, wherein the etching at least partially removes the layer of oxide.

16. The method of treating a substrate of claim 14, further comprising repeating the method.

17. The method of treating a substrate of claim 16, wherein repeating flowing the plasma effluents into the processing region of the semiconductor processing chamber comprises contacting exposed surfaces of the layers of silicon oxide with the plasma effluents.

18. The method of treating a substrate of claim 17, wherein the plasma effluents remove fluorine from the layers of silicon oxide.

19. The method of treating a substrate of claim 13, wherein the water vapor is flowed into the processing region without plasma enhancement.

20. The method of treating a substrate of claim 13, wherein the method is performed at a chamber temperature greater than or about 200° C.

* * * * *